(12) United States Patent
Kim et al.

(10) Patent No.: US 12,295,111 B2
(45) Date of Patent: May 6, 2025

(54) DISPLAY APPARATUS AND TILED DISPLAY APPARATUS INCLUDING THE SAME

(71) Applicant: LG Display Co., Ltd., Seoul (KR)

(72) Inventors: Geunyoung Kim, Paju-si (KR); Ohjong Kwon, Paju-si (KR)

(73) Assignee: LG Display Co., Ltd., Seoul (KR)

(*) Notice: Subject to any disclaimer, the term of this patent is extended or adjusted under 35 U.S.C. 154(b) by 245 days.

(21) Appl. No.: 17/873,910

(22) Filed: Jul. 26, 2022

(65) Prior Publication Data

US 2023/0033094 A1 Feb. 2, 2023

(30) Foreign Application Priority Data

Jul. 30, 2021 (KR) .................. 10-2021-0100915

(51) Int. Cl.
*H05K 5/02* (2006.01)
*H05K 5/00* (2006.01)

(52) U.S. Cl.
CPC ......... *H05K 5/0247* (2013.01); *H05K 5/0018* (2022.08); *H05K 5/0021* (2013.01); *H05K 5/0234* (2013.01)

(58) Field of Classification Search
CPC .. H05K 5/0247; H05K 5/0018; H05K 5/0021; H05K 5/0234

USPC ......................... 361/807, 809, 810
See application file for complete search history.

(56) References Cited

U.S. PATENT DOCUMENTS

| | | | | |
|---|---|---|---|---|
| 2,896,009 | A | * 7/1959 | Caveney | H02G 3/045 174/101 |
| 7,505,280 | B1 | * 3/2009 | Loucks | G06F 1/1632 361/752 |
| 2014/0007471 | A1 | * 1/2014 | Ottolenghi | A47B 87/0292 264/219 |
| 2021/0019105 | A1 | * 1/2021 | Cope | H04N 5/775 |
| 2021/0157371 | A1 | * 5/2021 | Mori | G09F 9/3026 |

FOREIGN PATENT DOCUMENTS

| | | | | |
|---|---|---|---|---|
| CN | 117316059 A | * 12/2023 | | G09F 9/33 |
| WO | WO-2018076396 A1 | * 5/2018 | | F21V 29/502 |
| WO | WO-2021108816 A2 | * 6/2021 | | G06F 1/1624 |

\* cited by examiner

*Primary Examiner* — Hung S. Bui
(74) *Attorney, Agent, or Firm* — Seed IP Law Group LLP

(57) ABSTRACT

A display apparatus that is easily installed and assembled and a tiled display apparatus including the same are provided. The display apparatus comprises a display panel, and a support member supporting the display panel, and a power transfer member rotatably disposed on a first side of the support member.

19 Claims, 16 Drawing Sheets

DISPLAY APPARATUS AND TILED DISPLAY APPARATUS INCLUDING THE SAME

CROSS-REFERENCE TO RELATED APPLICATION

This application claims the benefit of the Korean Patent Application No. 10-2021-0100915 filed on Jul. 30, 2021, which is hereby incorporated by reference as if fully set forth herein.

BACKGROUND

Technical Field

The present disclosure relates to a display apparatus for displaying an image and a tiled display apparatus including the same.

Description of the Related Art

Generally, a tiled display apparatus is an apparatus provided in an indoor or outdoor exhibition hall, stage, etc., to display various kinds of visual information, and becoming larger in size with the development of information technology. Recently, in order to transfer an image in the form of a large screen, the large screen is implemented by connecting a plurality of display panels.

The tiled display apparatus is provided so that two or more display panels are disposed in a rectangular frame or housing having a predetermined width and length in a matrix and connected to each other.

In the tiled display apparatus, each of a plurality of display panels is fixed to an alignment device installed on a wall or a floor, and a position of each of the display panels is adjusted by the alignment device to prevent bright lines or dark lines from occurring between the display panels adjacent to each other in an up and down direction and a left and right direction. Also, in the tile display apparatus, it is additionally required to connect a power line to each of the plurality of display panels before each of the plurality of display panels is completely aligned by the alignment device.

Therefore, in this tiled display apparatus, since each of the plurality of display panels should be fixed to each of the alignment devices and aligned with each other, it takes a long time to install the tiled display apparatus. Also, since a power line should be connected to each of the plurality of display panels, a problem occurs in that it takes a longer time to install the tiled display apparatus.

BRIEF SUMMARY

The present disclosure has been made in view of the above problems and it is an object of the present disclosure to provide a display apparatus that is easily installed and assembled and a tiled display apparatus including the same.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a display panel, and a support member supporting the display panel, wherein the support member includes a main body supporting the display panel, and a power transfer member disposed on a first side of the main body.

In accordance with another aspect of the present disclosure, the above and other objects can be accomplished by the provision of a display apparatus comprising a display panel, a support member supporting the display panel, and a power transfer member rotatably disposed on a first side of the support member.

In accordance with other aspect of the present disclosure, the above and other objects can be accomplished by the provision of a tiled display apparatus comprising a stand frame, and a plurality of display apparatuses connected to the stand frame and tiled.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
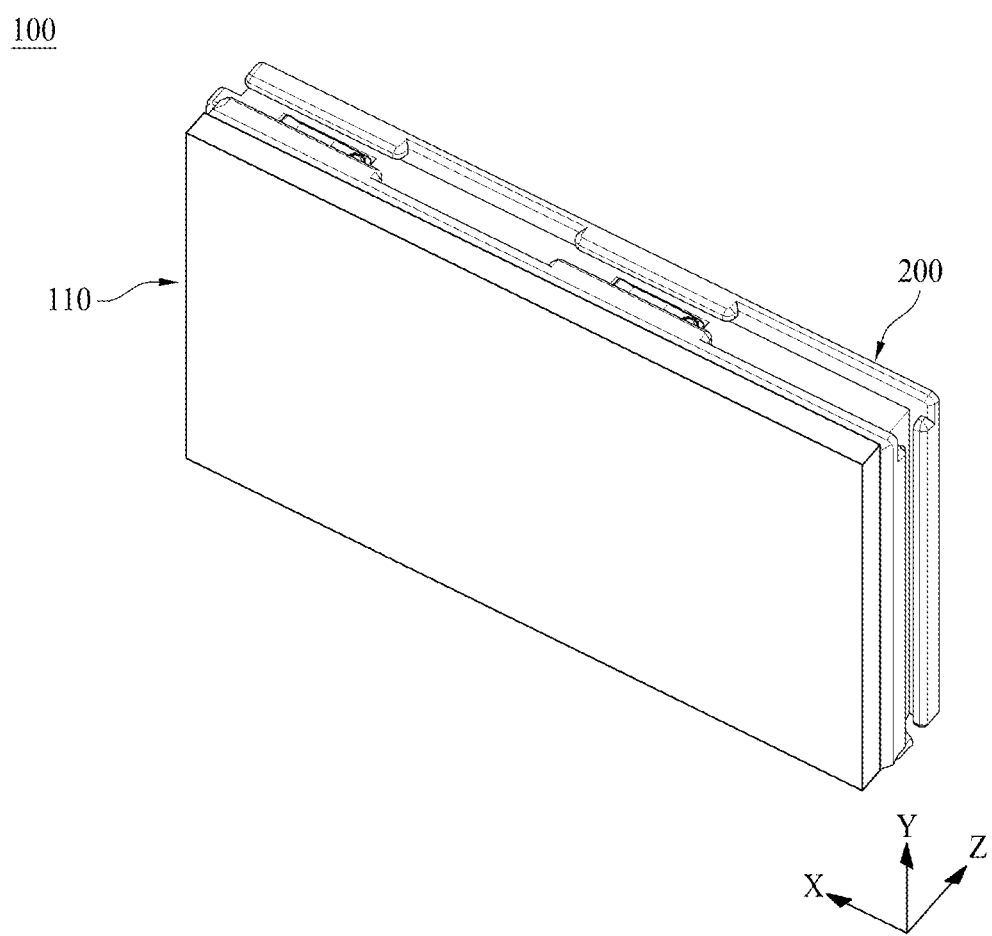
FIG. 1 is a perspective view illustrating a display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~, "over~," under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 2:
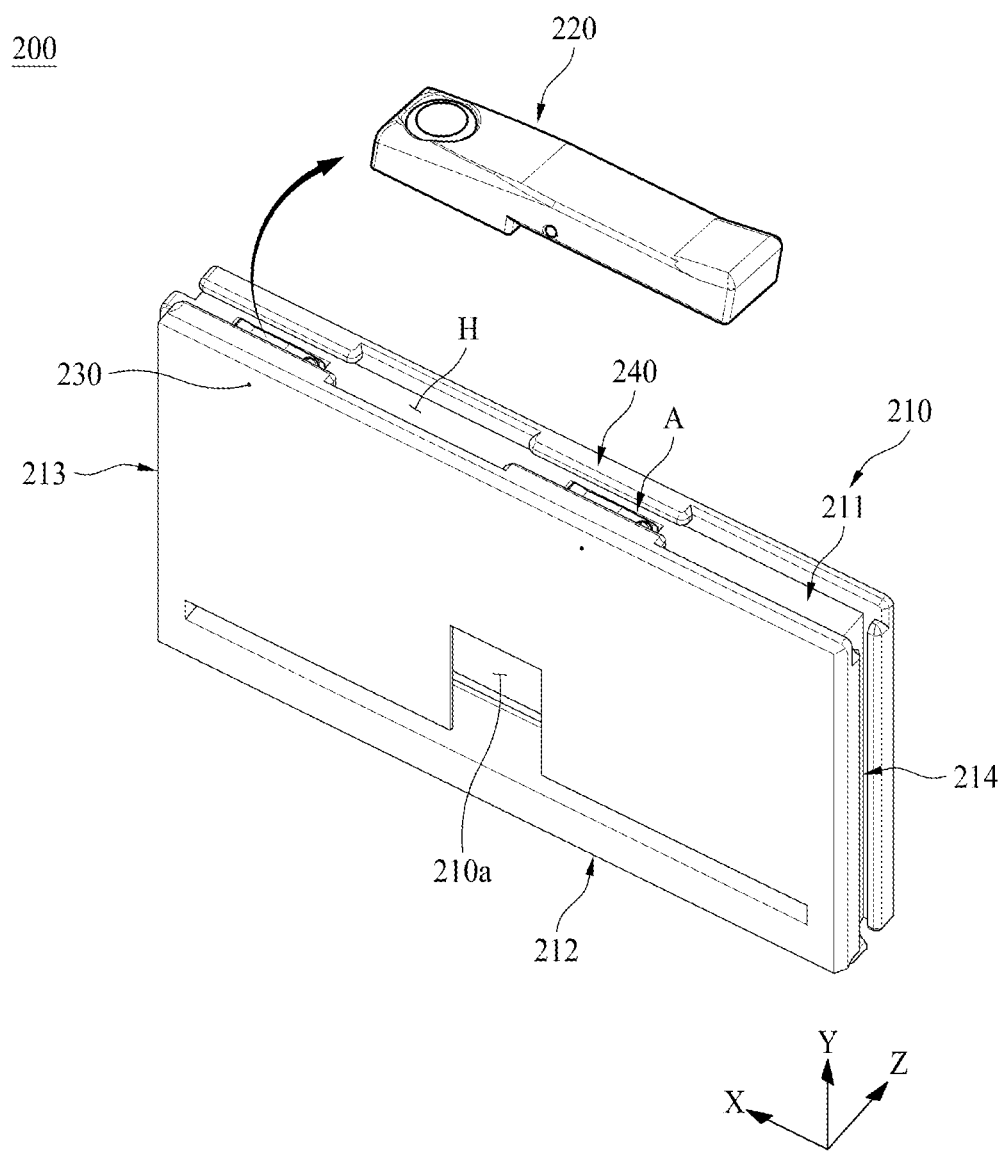
FIG. 2 is a perspective view illustrating a support member of FIG. 1.
Figure 3A:
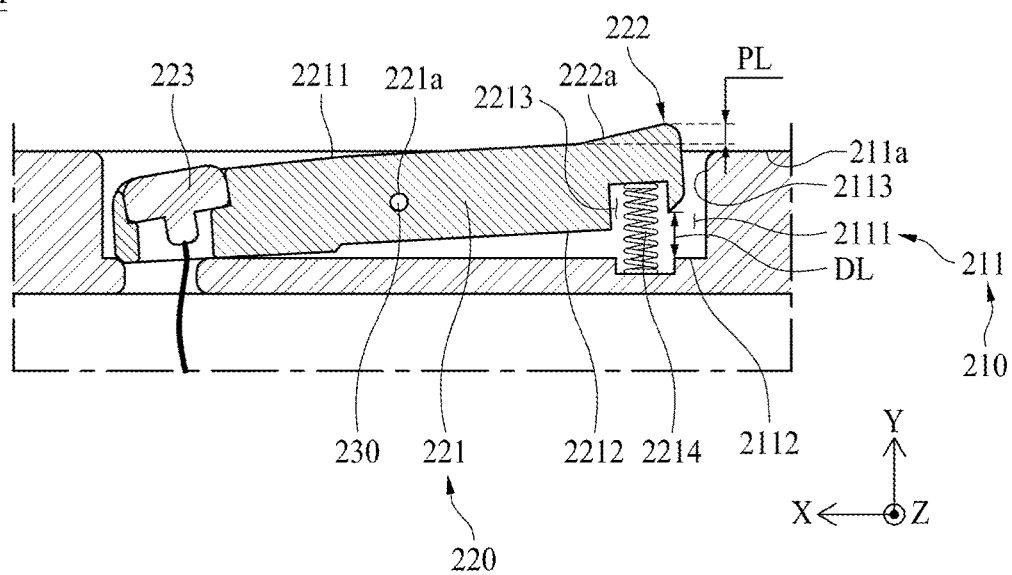
FIG. 3A is a schematic cross-sectional view illustrating an operation state of a portion A of FIG. 2 before a plurality of display apparatuses according to one embodiment of the present disclosure are coupled to each other.
Figure 3B:
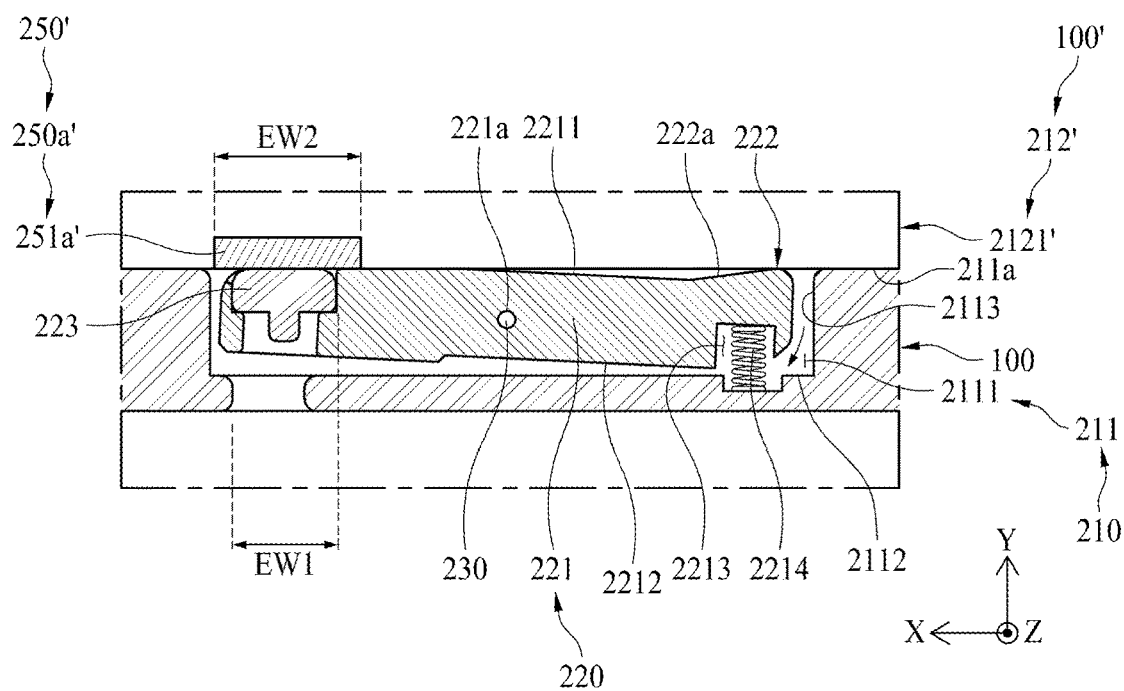
FIG. 3B is a schematic cross-sectional view illustrating an operation state of a portion A of FIG. 2 after a plurality of display apparatuses according to one embodiment of the present disclosure are coupled to each other.
Figure 4:
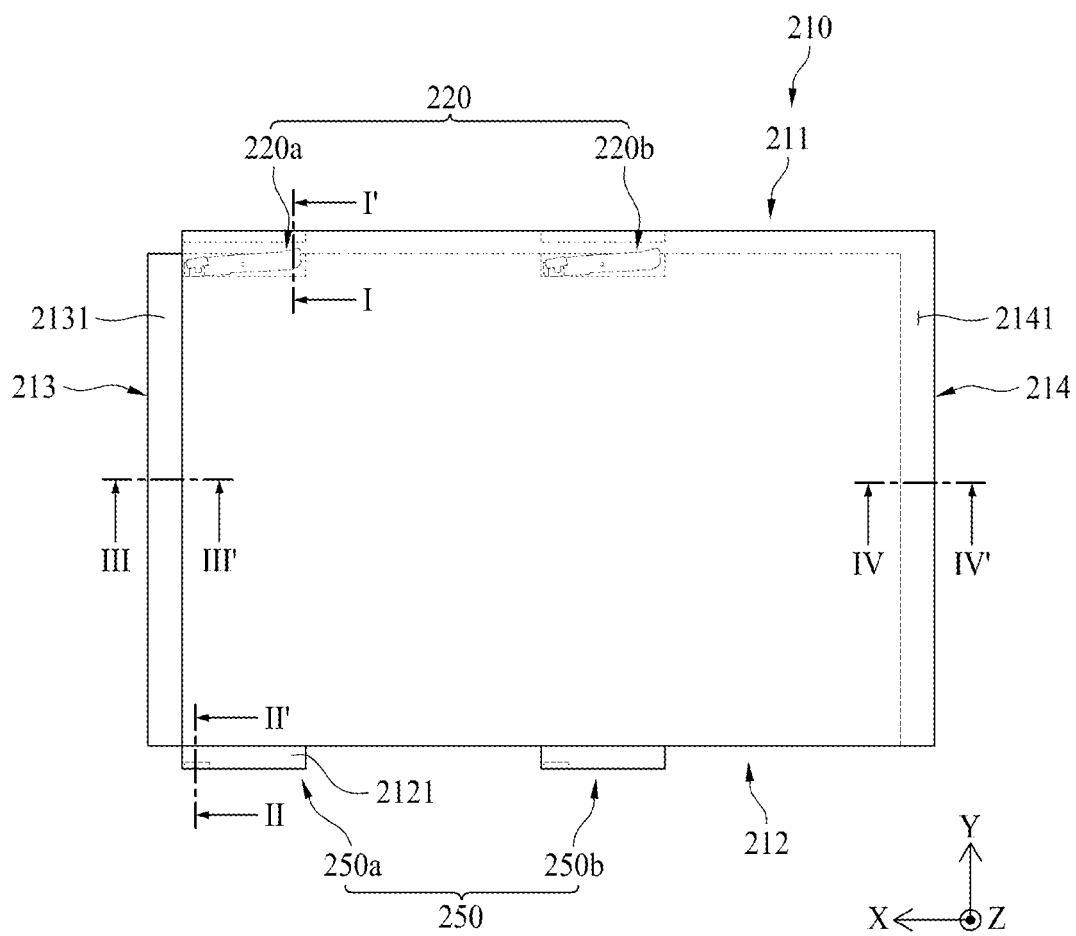
FIG. 4 is a schematic front view of FIG. 2.
Figure 5A:
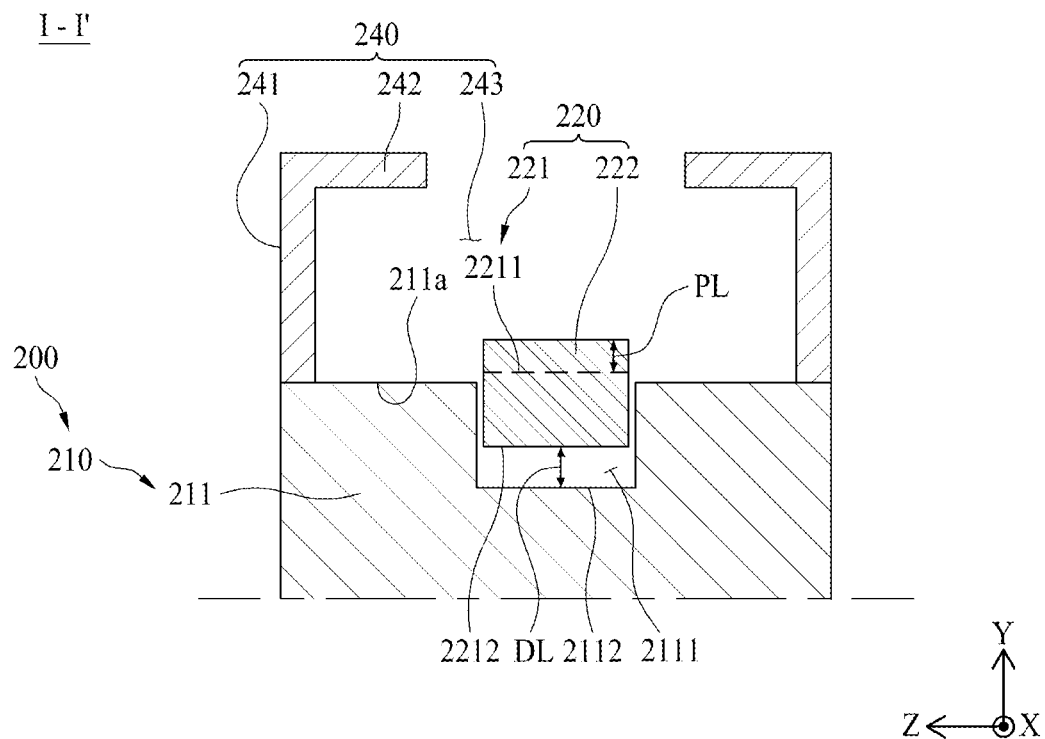
FIG. 5A is a schematic cross-sectional view taken along line I-I' shown in FIG. 4.
Figure 5B:
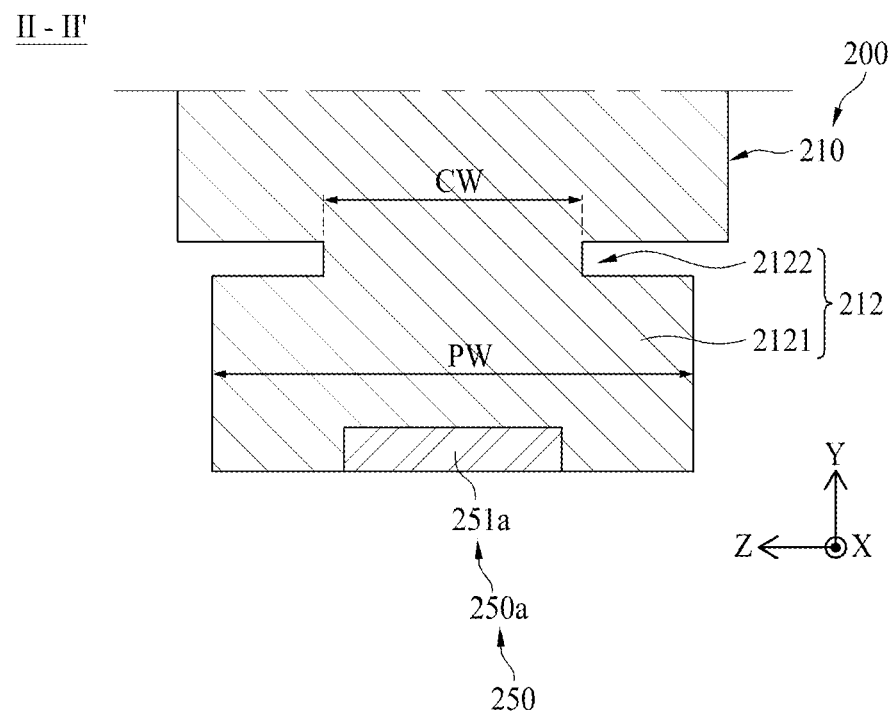
FIG. 5B is a schematic cross-sectional view taken along line II-IF shown in FIG. 4.
Figure 5C:
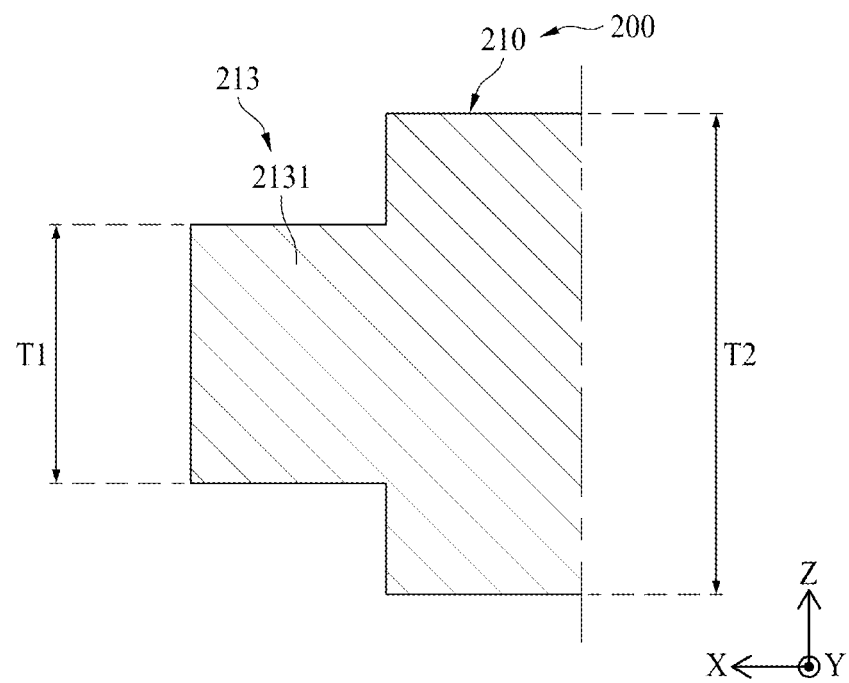
FIG. 5C is a schematic cross-sectional view taken along line shown in FIG. 4.
Figure 5D:
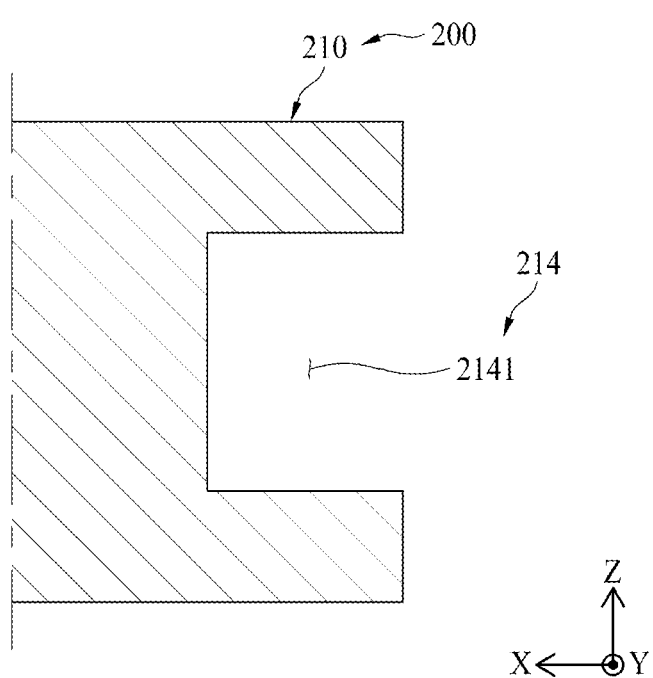
FIG. 5D is a schematic cross-sectional view taken along line IV-IV' shown in FIG. 4.

FIG. 1 is a perspective view illustrating a display apparatus according to one embodiment of the present disclosure, FIG. 2 is a perspective view illustrating a support member of FIG. 1, FIG. 3A is a schematic cross-sectional view illustrating an operation state of a portion A of FIG. 2 before a plurality of display apparatuses according to one embodiment of the present disclosure are coupled to each other, FIG. 3B is a schematic cross-sectional view illustrating an operation state of a portion A of FIG. 2 after a plurality of display apparatuses according to one embodiment of the present disclosure are coupled to each other, FIG. 4 is a schematic front view of FIG. 2, FIG. 5A is a schematic cross-sectional view taken along line I-I' shown in FIG. 4, FIG. 5B is a schematic cross-sectional view taken along line II-IF shown in FIG. 4, FIG. 5C is a schematic cross-sectional view taken along line shown in FIG. 4, and FIG. 5D is a schematic cross-sectional view taken along line IV-IV' shown in FIG. 4.

Hereinafter, the following description will be based on that a display apparatus 100 according to one embodiment of the present disclosure is an organic light emitting display apparatus, but is not limited thereto. That is, the display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 5D, the display apparatus 100 according to one embodiment of the present disclosure includes a display panel 110, a support member 200 supporting the display panel 110, and a power transfer member 220 rotatably disposed on a first side of the support member 200. The first side of the support member 200 may be a first side of a main body 210 that forms a body of the support member 200.

The display panel 110 may be provided in a rectangular shape. The display panel 110 may be coupled to the support member 200. The display panel 110 according to one example may be coupled to a front surface of the support member 200 by at least one of adhesive bonding, bolt coupling or tight fit. Therefore, the display panel 110 may be moved together with the support member 200. For example, when the support member 200 slides, the display panel 110 coupled to the support member 200 may also slide together.

A driving circuit for driving the display panel 110 may be disposed in a storage 210a provided in the main body 210, and the display panel 110 may be connected to the driving circuit disposed in the storage 210*a* through a line or the like. Therefore, the display panel 110 may be operated by the driving circuit to output an image.

The support member 200 may support the display panel 110. The support member 200 may be coupled to a rear surface of the display panel 110 and coupled to a stand frame, which will be described later, to support the display panel 110. When a plurality of display apparatuses 100 according to one embodiment of the present disclosure are tiled, the support members 200 may be coupled to each other. In this case, in order to prevent a bright line or a dark line between the display apparatuses 100 from being visible to a user, the support members 200 may be provided to be larger than the display panel 110 and coupled to each other. For example, as shown in FIG. 4, the support member 200 may be provided to be larger than the display panel 110 due to a structure (or fastening portion 2121 and a protrusion 2131) more outwardly protruded than the display panel. The display apparatus 100 according to one embodiment of the present disclosure may be tiled by being connected to another display apparatus 100' according to one embodiment of the present disclosure through the structure.

Referring to FIGS. 2 and 4, the support member 200 may include a main body 210, a power transfer member 220, a hinge member 230, a support 240 and a power receiving member 250.

The main body 210 may form an entire external appearance of the support member 200. The main body 210 according to an example may be formed in a rectangular shape, but is not limited thereto. In the present disclosure, the main body 210 which is provided in a rectangular shape will be described by way of example. The main body 210 may include a first side 211, a second side 212, a third side 213, and a fourth side 214.

The first side 211 of the main body 210 may be a first side of the support member 200, and may refer to a surface positioned on an upper portion of the support member 200 based on FIG. 2. The power transfer member 220 may be rotatably coupled to the first side 211 of the main body 210. For example, as shown in FIG. 3A, the power transfer member 220 may be coupled to the first side 211 of the support member 200 (or main body 210) through the hinge member 230. The first side 211 of the main body 210 may include an upper surface 211*a*, an insertion groove 2111, a bottom surface 2112, and a vertical surface 2113.

Referring to FIGS. 2 and 3A, the upper surface 211*a* of the first side 211 may be a surface formed below the support 240 in a Y-axis direction, and may be a surface constituting most of the first side 211 of the main body 210 along X-axis direction. As the power transfer member 220 is rotated around the hinge member 230, one side or the other side of the power transfer member 220 may be positioned to be higher or lower than the upper surface 211*a* of the first side 211. For example, as shown in FIG. 3A, before a plurality of display apparatuses 100 according to one embodiment of the present disclosure are coupled, one side of the power transfer member 220 may be more protruded than the upper surface 211*a* and positioned to be higher than the upper surface 211*a*, and the other side of the power transfer member 220 may be positioned to be lower than the upper surface 211*a* and inserted into the insertion groove 2111. As shown in FIG. 3B, after the plurality of display apparatuses 100 according to one embodiment of the present disclosure are coupled, one side and the other side of the power transfer member 220 may be positioned to be the same as the upper surface 211*a*. In this case, a stepped portion 222 provided at one side of the power transfer member 220 may be pressed by a lower surface of another display apparatus (or second display apparatus 100') and thus positioned in the insertion groove 2111, and a terminal portion 223 provided on the other side of the power transfer member 220 may be rotated (or swung) in a clockwise direction to be in contact with a power receiving terminal 251*a'* provided on a lower surface of another display apparatus (or second display apparatus 100'). Thus, power (or voltage) may be transferred from the first display apparatus 100 to another display apparatus (or second display apparatus 100').

Referring back to FIGS. 2 and 3A, the insertion groove 2111 is for inserting the power transfer member 220. As shown in FIG. 3A, the insertion groove 2111 may be a groove formed to be recessed from the upper surface 211*a* in the Y-axis direction on the first side 211 of the main body 210. The insertion groove 2111 may be formed to be longer than a length of the power transfer member 220 in the X-axis direction. In addition, the insertion groove 2111 may be formed to be deeper than a thickness (or length in the Y-axis direction) of the power transfer member 220. Therefore, as shown in FIG. 3A, at least a portion of the power transfer member 220 may be inserted into the insertion groove 2111, and may be rotated based on the hinge member 230 in a state that it is inserted into the insertion groove 2111.

The bottom surface 2112 may be provided to be adjacent to the insertion groove 2111, and may be formed on the first side 211. The bottom surface 2112 may be a base surface of the insertion groove 2111. An elastic member for rotating the power transfer member 220 may be coupled to the bottom surface 2112.

The vertical surface 2113 may be a surface perpendicular to the bottom surface 2112, and may be formed on the first side 211. The vertical surface 2113 may be a side of the insertion groove 2111. The vertical surface 2113 is provided to be spaced apart from the power transfer member 220 as much as a predetermined distance, so that the vertical surface 2113 may not interfere with rotation of the power transfer member 220.

As shown in FIG. 3A, an elastic member may be disposed between one side and the bottom surface 2112 of the power transfer member 220. Therefore, in a state that the plurality of display apparatuses 100 are not tiled, as shown in FIG. 3A, one side of the power transfer member 220 may be protruded in the Y-axis direction above the upper surface 211*a* of the first side 211 based on the hinge member 230. In this case, the other side of the power transfer member 220 is disposed below the upper surface 211*a* of the first side 211 in the Y-axis direction and thus disposed in the insertion groove 2111 formed on the first side 211.

A horizontal direction of the display panel 110 or the support member 200 may be the X-axis direction or a first direction. The Y-axis direction may be a direction perpendicular to the X-axis direction, and may be a vertical direction or a second direction of the display panel 110 or the support member 200. A Z-axis direction may be a third direction perpendicular to each of the X-axis direction and the Y-axis direction, and may be a thickness direction of the display panel 110 or the support member 200.

As shown in FIG. 3B, when the plurality of display apparatuses 100 (or first display apparatus) according to one embodiment of the present disclosure are tiled, as a lower surface (or second side 212') of another display apparatus 100' (or second display apparatus) is positioned to be adjacent to the first side 211 of the first display apparatus 100, the second side 212' of the second display apparatus 100' may press one side of the power transfer member 220 of the first display apparatus 100 more protruded than the upper surface 211*a* of the first side 211 of the first display apparatus 100. Therefore, the other side of the power transfer member 220 of the first display apparatus 100 may be rotated clockwise based on the hinge member 230, and thus may be in contact with the power receiving terminal 251*a*' provided in the second display apparatus 100' to receive power. The power receiving terminal 251*a*' may be included in a fastening portion 2121' provided on the second side 212' of the second display apparatus 100'. Therefore, as shown in FIG. 3B, power sources of the first display apparatus 100 and the second display apparatus 100' may be connected to each other by being tiled together. As a result, when the first display apparatus 100 and the second display apparatus 100' are tiled, since the power sources are connected to each other through the power transfer member 220 of the first display apparatus 100 and the power receiving terminal 251*a*' of the second display apparatus 100', the installation time may be significantly reduced as compared with the case that the plurality of display apparatuses are connected using a separate power line. Since both the first display apparatus 100 and the second display apparatus 100' may be implemented by the display apparatus according to one embodiment of the present disclosure, elements of the second display apparatus 100' may be the same as those of the first display apparatus 100 in view of arrangement, functions and effects. Therefore, the fastening portion 2121' provided on the second side 212' of the second display apparatus 100' and a power receiving member 250' having the power receiving terminal 251*a*' provided in the fastening portion 2121' may be the same elements as the fastening portion 2121 provided on the second side 212 of the first display apparatus 100 and the power receiving member 250 having a power receiving terminal 251*a* provided in the fastening portion 2121. As shown in FIG. 4, since the power receiving member 250 of the first display apparatus 100 includes the first power receiving member 250*a* and a second power receiving member 250*b*, the power receiving member 250' of the second display apparatus 100' may include the first power receiving member 250*a*' and a second power receiving member (not shown).

Hereinafter, the power transfer member 220 of the display apparatus 100 according to one embodiment of the present disclosure will be described in more detail with reference to FIGS. 2 to 5D.

The power transfer member 220 is to transfer power. When the plurality of display apparatuses 100 according to one embodiment of the present disclosure are tiled, the power transfer member 220 according to an example may transfer power by connecting the adjacent display apparatuses 100. For example, the power transfer member 220 provided in the first display apparatus 100 may be mounted on a stand frame that will be described later, and may receive power from a power supply member provided in the stand frame to transfer the power to the second display apparatus 100' tiled in the first display apparatus 100. The terminal portion 223 of the power transfer member 220 may be connected to the power receiving terminal 251*a* (shown in FIG. 5B) of the power receiving member 250 provided on the second side 212 through a line (or conductive tape), whereby the power supplied from the power supply member to the power receiving member 250 may be transferred to the display apparatus 100' through a line (or conductive tape). The power receiving member 250 may be in contact with the power transfer member provided in the stand frame or connected to the power supply member provided in the stand frame through a line, thereby receiving the power from the power supply member.

The display apparatus 100 according to one embodiment of the present disclosure may include a plurality of power transfer members 220. The plurality of power transfer members 220 may be provided to transfer a positive voltage and a negative voltage. For example, as shown in FIG. 4, two power transfer members 220 may be provided to be spaced apart from each other on the first side 211 of the main body 210. Based on FIG. 4, the power transfer member 220 may include a first power transfer member 220*a* positioned at a left side and a second power transfer member 220*b* disposed at a right side to be spaced apart from the first power transfer member 220*a*. The first power transfer member 220*a* may be in contact with the power receiving member provided on a lower surface of another display apparatus (or second display apparatus 100') coupled to the first side 211 of the main body 210, thereby transferring the positive voltage supplied from the power supply member to another display apparatus. The second power transfer member 220*b* may be in contact with another power receiving member provided on the lower surface of another display apparatus (or second display apparatus 100') coupled to the first side 211 of the main body 210, thereby transferring the negative voltage supplied from the power supply member to another display apparatus. However, the present disclosure is not limited to the two power transfer members. Only one power transfer member 220 may be provided if the positive voltage and the negative voltage may be transferred to another display apparatuses that is tiled together with the display apparatus 100 according to another embodiment of the present disclosure.

Referring back to FIGS. 2 to 4, the power transfer member 220 may include a rotating portion 221, a stepped portion 222 at a first portion of the rotating portion 221, and a terminal portion 223 at a second portion, opposite to the first portion, of the rotating portion 221. The first portion of the rotating portion 221 may be a first end of the rotating portion 221. The second portion of the rotating portion 221 may be a second end of the rotating portion 221.

The rotating portion 221 forms an overall external appearance of the power transfer member 220. The rotating portion 221 may be rotatably coupled to the first side 211 of the main body 210. The rotating portion 221 may include a through hole 221*a* through which the hinge member 230 passes. As shown in FIG. 3A, the through hole 221*a* may be formed in a central area of the rotating portion 221 by passing through the rotating portion 221 in the Z-axis direction. The through hole 221*a* may be disposed in a line in the Z-axis direction in a hole formed on the first side 211 of the main body 210, whereby the hinge member 230 may be inserted into the through hole 221*a* through the hole formed in the first side 211 of the main body 210. As both ends of the hinge member 230 inserted into the through hole 221*a* are coupled to the first side 211 of the main body 210, the power transfer member 220 may be rotatably coupled to the first side 211 of the main body 210. The stepped portion 222 may be disposed at one side of the rotating portion 221, and the terminal portion 223 may be disposed at the other side of the rotating portion 221. The stepped portion 222 and the terminal portion 223 may be rotated (or swung) in their opposite directions based on the hinge member 230. The rotating portion 221 may include an upper surface 2211, a lower surface 2212, an elastic groove 2213, and an elastic member 2214.

The upper surface 2211 is a surface positioned above the rotating portion 221 in the Y-axis direction. The stepped portion 222 may be disposed on the upper surface 2211 positioned on one side of the rotating portion 221. The terminal portion 223 may be coupled to the rotating portion 221 so that the terminal portion 223 is more protruded than the upper surface 2211 positioned on the other side of the rotating portion 221. Therefore, when the rotating portion 221 is rotated (or swung) clockwise based on the hinge member 230, the terminal portion 223 may be in contact with the power receiving member 250' of another display apparatus (or second display apparatus 100') that is tiled on the first side 211 of the main body 210.

The lower surface 2212 is a surface positioned below the rotating portion 221 in the Y-axis direction. The lower surface 2212 may be disposed in parallel with the upper surface 2211. The lower surface 2212 may be disposed to face the bottom surface 2112 of the insertion groove 2111.

The elastic groove 2213 is provided at one side of the rotating portion 221, and is a groove recessed from the lower surface 2212. One side of the elastic member 2214 is inserted into the elastic groove 2213. As shown in FIG. 3A, as one side of the elastic member 2214 is inserted into the elastic groove 2213, the elastic member 2214 may be shrunk or expanded without being separated from the elastic groove 2213 even though the power transfer member 220 rotates. The other side of the elastic member 2214 may be inserted into a bottom groove formed on the bottom surface 2112 to correspond to the elastic groove 2213. Since the other side of the elastic member 2214 is inserted into the bottom groove, the elastic member 2214 may be shrunk or expanded without being separated from the bottom groove even though the power transfer member 220 rotates.

The elastic member 2214 is to rotate the power transfer member 220. The elastic member 2214 according to an example is supported in the bottom groove and expanded by an elastic restoring force before the plurality of display apparatuses 100 are coupled, thereby rotating one side of the power transfer member 220 in a counterclockwise direction. Therefore, as shown in FIG. 3A, the stepped portion 222 provided at one side of the power transfer member 220 may be more protruded than the upper surface 211a of the first side 211. When the plurality of display apparatuses 100 according to one embodiment of the present disclosure are coupled, the stepped portion 222 of the power transfer member 220 of the first display apparatus 100 may be pressed by the fastening portion 2121' of the second side 212' of another display apparatus 100' (or second display apparatus 100'), whereby the elastic member 2214 of the first display apparatus 100 may be shrunk. In this case, the terminal portion 223 disposed on the other side of the power transfer member 220 may be in contact with the power receiving member 250' provided in the fastening portion 2121' of the second display apparatus 100'. In this case, the power receiving member 250' may mean the power receiving terminal 251a'. Therefore, the terminal portion 223 of the first display apparatus 100 and the power receiving terminal 251a' of the second display apparatus 100' are in contact with each other, whereby the power may be transferred from the first display apparatus 100 to the second display apparatus 100'.

The stepped portion 222 may be provided at one side of the rotating portion 221. The stepped portion 222 may be formed to be protruded from the upper surface 2211 of the rotating portion 221 in the thickness direction or the Y-axis direction of the rotating portion 221. Therefore, when the plurality of display apparatuses 100 are coupled (or tiled), the stepped portion 222 of the first display apparatus 100 may be pressed by the fastening portion 2121' when the fastening portion 2121' of the second display apparatus 100' is slid to overlap the stepped portion 222, whereby the stepped portion 222 may be rotated clockwise as shown in FIG. 3B.

The stepped portion 222 may include an inclined surface 222a provided on at least one side thereof.

When the second display apparatus 100' is slid and coupled to the first display apparatus 100, the inclined surface 222a serves to allow the stepped portion 222 not to interfere with the sliding of the second display apparatus 100'. That is, the inclined surface 222a of the stepped portion 222 of the first display apparatus 100 allows one side of the power transfer member 220 to be more easily pressed by the fastening portion 2121' of the second display apparatus 100'. The inclined surface 222a may be provided on the left side of the stepped portion 222 as shown in FIG. 3A, but is not limited thereto. The inclined surface 222a may be provided to surround the right side of the stepped portion 222 or the entire edge of the stepped portion 222 if the stepped portion does not interfere with the second display apparatus 100' (or another display apparatus). The inclined surface 222a may be provided to be more than 0° and less than 90° from the upper surface 2211 of the rotating portion 221. In addition, the inclined surface 222a may include at least one curved surface not a straight line shown in FIG. 3A.

As the elastic member 2214 is disposed on the lower surface of one side of the power transfer member 220, the elastic member 2214 may be expanded by the elastic restoring force before the plurality of display apparatuses 100 are coupled. Therefore, a distance DL between the lower surface 2212 and the bottom surface 2112 of the rotating portion 221 corresponding to the stepped portion 222 may be equal to or greater than a length PL of the stepped portion 222 protruded from the upper surface 2211. Therefore, when the plurality of display apparatuses 100 are coupled to each other, one side of the power transfer member 220 of the first display apparatus 100 may be pressed by the fastening portion 2121' of the second display apparatus 100' and thus inserted into the insertion groove 2111, whereby the terminal portion 223 provided on the other side of the power transfer member 220 may be positioned at the same height as that of the upper surface 211a of the first side 211 or may be more protruded than the upper surface 211a of the first side 211, and thus may be in contact with the power receiving terminal 251a' of the second display apparatus 100'.

Referring back to FIGS. 2 to 4, the terminal portion 223 may be provided on the other side of the rotating portion 221. Therefore, since the terminal portion 223 and the stepped portion 222 may be disposed to be opposite to each other based on the through hole 221a, the terminal portion 223 and the stepped portion 222 may be rotated (or swung) in their opposite directions based on the hinge member 230.

The terminal portion 223 is to transfer the power to the display apparatuses to be coupled when the plurality of display apparatuses 100 are coupled (or tiled) to each other. The terminal portion 223 may be made of a conductive material capable of transferring the power, and may be inserted into a terminal groove formed on the other side of the rotating portion 221 as shown in FIG. 3A. The terminal portion 223 according to an example may be coupled to the terminal groove by tight fit, but is not limited thereto. The terminal portion 223 may be coupled to the rotating portion 221 by other methods such as adhesive bonding. When the terminal portion 223 is coupled to the terminal groove by tight fit, that is, when the terminal portion 223 is not fixedly coupled to the terminal groove, the degree of freedom may be more improved than the case that the terminal portion 223 is coupled to the rotating portion 221 by adhesion. Therefore, when the plurality of display apparatuses 100 are coupled, since the terminal portion 223 may be disposed in accordance with a shape of the lower surface of the power receiving terminal 251a' of the second display apparatus 100', an area of the terminal portion 223 of which upper surface is in contact with the lower surface of the power receiving terminal 251a' of the second display apparatus 100' may be further increased, whereby the power may be more efficiently transferred to the second display apparatus 100' without leakage of the power.

Referring to FIGS. 2 to 3B, the hinge member 230 is for rotatably coupling the power transfer member 220 to the first side 211 of the main body 210. The hinge member 230 may be formed of a cylindrical pin having a diameter smaller than that of the through hole 221a of the power transfer member 220. The hinge member 230 may be inserted into the through hole 221a of the power transfer member 220 and its both ends may be coupled to the first side 211 of the main body 210. Therefore, the power transfer member 220 positioned between both ends of the hinge member 230 may be rotated counterclockwise by the elastic restoring force of the elastic member 2214, or may be pressed by another display apparatus (or second display apparatus 100') and then rotated clockwise.

Referring to FIGS. 2 to 5A, the support 240 may be provided to be protruded from the first side 211 of the main body 210. The support 240 is to support the second side 212' of the second display apparatus 100', more specifically the fastening portion 2121' provided on the second side 212', as shown in FIG. 3B, when the plurality of display apparatuses, for example, the first display apparatus 100 and the second display apparatus 100' are coupled. The support 240 according to an example may include may include a pair of guide members 241, a pair of separation preventing members 242 (also referred to as a pair of arms 242 or a pair of locking members 242), and a support groove 243.

The pair of guide members 241 may be formed to be protruded from the first side 211 of the main body 210 in the Y-axis direction. As shown in FIG. 5A, the pair of guide members 241 may be formed at the edge of the first side 211 so as to be spaced apart from each other in the Z-axis direction, that is, in the thickness direction of the main body 210. Therefore, each of the pair of guide members 241 may be disposed in parallel with the front surface of the display panel 110 coupled to the front surface of the main body 210. Since each of the pair of guide members 241 is thinner than a thickness of the main body 210, a predetermined space may be formed between the pair of guide members 241, and the space may be a support groove 243. As the pair of guide members 241 are formed to be protruded in the Y-axis direction, the fastening portion 2121' of the second display apparatus 100' may be inserted into the support groove 243. Therefore, the pair of guide members 241 may support the fastening portion 2121' (or the side of the fastening portion 2121') of the second display apparatus 100' that is coupled (or tiled) to the first display apparatus 100. As the pair of guide members 241 support the fastening portion 2121' (or the side of the fastening portion 2121') of the second display apparatus 100', the second display apparatus 100' may be prevented from being inclined in the Z-axis direction in a state that it is inserted into the first display apparatus 100, and may slide along the X-axis direction.

The pair of separation preventing members 242 may be connected to the pair of guide members 241 in the Z-axis direction that is a thickness direction of the main body 210. Thus, as shown in FIG. 5A, the pair of separation preventing members 242 may be disposed in parallel with the first side 211 (or upper surface 211a) of the first body 210. The pair of separation preventing members 242 are to prevent the fastening portions 2121' inserted into the support grooves 243 from being separated. For example, the pair of separation preventing members 242 may support the upper surface of the fastening portion 2121' to prevent the fastening portion 2121' inserted into the support groove 243 from being separated (or spaced apart) in the Y-axis direction. This will be described later in more detail with reference to FIG. 6B.

As the pair of separation preventing members 242 support the upper surface of the fastening portion 2121' of the second display apparatus 100', the lower surface of the fastening portion 2121' may press the stepped portion 222 provided at one side of the power transfer member 220, and thus the power receiving terminal 251a' provided to be exposed to the lower surface of the fastening portion 2121' may be in contact with the terminal portion 223 provided on the other side of the power transfer member 220. In this case, as shown in FIG. 3B, the power receiving terminal 251a' of the second display apparatus 100' may be positioned to be spaced apart from the stepped portion 222 of the first display apparatus 100 in the X-axis direction.

Referring back to FIG. 5A, each of the pair of separation preventing members 242 may have a length less than a half of the thickness of the main body 210. Therefore, the pair of separation preventing members 242 may be disposed to be spaced apart from each other in the Z-axis direction, and the support groove 243 may be communicated with the outside through the pair of separation preventing members 242 spaced apart from each other. As shown in FIG. 5A, since a distance between the pair of separation preventing members 242 is shorter than that between the pair of guide members 241, the fastening portion 2121' of the second display apparatus 100' may be inserted into the support groove 243 of the first display apparatus 100 in the Y-axis direction through the space in which the pair of separation preventing members 242 are not provided in the first display apparatus 100, and then may slide in the X-axis direction, thereby being in contact with the pair of separation preventing members 242 of the first display apparatus 100. In this case, the space in which the pair of separation preventing members 242 are not provided in the first display apparatus 100 may be a detachable groove H (shown in FIG. 2). Therefore, the detachable groove H may be a portion of the support groove 243, and may be disposed to be adjacent to the pair of separation preventing members 242. For example, referring to FIG. 2, the detachable groove H may be disposed to be adjacent to each of the support 240 positioned at the left side in the X-axis direction and the support 240 positioned at the right side. Therefore, based on FIG. 2, the support 240 and the detachable groove H, which are positioned at the left side, and the support 240 and the detachable groove H, which are positioned at the right side, may be alternately disposed in the X-axis direction. The fastening portion 2121' of the second display apparatus 100' may be inserted into the support groove 243 of the first display apparatus 100 through the detachable groove H, and in this state, may be slid in the X-axis direction to be positioned to overlap the pair of separation preventing members 242 of the support 240 of the first display apparatus 100 in the Y-axis direction. Therefore, the support 240 of the first display apparatus 100 may prevent the second display apparatus 100', which is coupled (or tiled), from being separated in the Y-axis direction.

Meanwhile, the power transfer member 220 may be positioned between the pair of guide members 241 in the thickness direction of the first side 211. Although FIG. 5A shows that the power transfer member 220 is positioned at the center in the thickness direction of the first side 211, the power transfer member may be positioned in other places within a range between the pair of guide members 241 when the power transfer member may transfer or apply a power to the second display apparatus 100' that is coupled or tiled. The position of the power receiving member 250' provided in the fastening portion 2121' of the second display apparatus 100' may be also changed depending on the position of the power transfer member 220 when the power transfer member 220 is changed to be positioned at the other place not the center. This is because that the power may be transferred or applied to the second display apparatus 100' only when the terminal portion 223 of the power transfer member 220 of the first display apparatus 100 and the power receiving member 250' of the second display apparatus 100' are to be in contact with each other.

As described above, the length PL of the stepped portion 222 protruded from the upper surface 2211 of the rotating portion 221 may be equal to or shorter than the length DL between the lower surface 2212 and the bottom surface 2112 of the rotating portion 221. Therefore, when the stepped portion 222 of the first display apparatus 100 is pressed by the fastening portion 2121' of the second display apparatus 100', since the stepped portion 222 of the first display apparatus 100 may be sufficiently inserted into the insertion groove 2111, the terminal portion 223 of the first display apparatus 100 may be protruded from the insertion groove 2111, and thus may be in contact with the power receiving member 250' provided in the fastening portion 2121' of the second display apparatus 100'.

Referring to FIGS. 4 and 5B, in the display apparatus 100 according to one embodiment of the present disclosure, the second side 212 may be disposed in parallel with the first side 211 of the main body 210. The second side 212 according to an example may be a surface positioned below the first side 211 in the Y-axis direction based on FIG. 4. Therefore, when the first display apparatus 100 and the second display apparatus 100' are coupled to each other, the second side 212' of the second display apparatus 100' may be coupled to the support 240 provided on the first side 211 of the first display apparatus 100. The second side 212 of the main body 210 may include a fastening portion 2121 and a recess 2122.

The fastening portion 2121 may be inserted into the support groove 243 provided between the pair of guide members 241. In this case, the pair of guide members 241 and the support groove 243 provided between the pair of guide members 241 may be a pair of guide members and a support groove, which are included in another display apparatus (or third display apparatus) (not shown) coupled to the second side 212 of the main body 210. That is, the pair of guide members and the support groove may be those of the third display apparatus (not shown) that is coupled or tiled below based on FIG. 4. In this case, the fastening portion 2121 may be included in the first display apparatus 100. Therefore, when the first display apparatus 100 and the third display apparatus are coupled or tiled, the fastening portion 2121 of the first display apparatus 100 may be inserted into the support groove of the third display apparatus, whereby the pair of guide members of the third display apparatus may support the side of the fastening portion 2121 of the first display apparatus 100 so that the fastening portion 2121 of the first display apparatus 100 fails to move in the Z-axis direction. In this state, when the first display apparatus 100 slides in the X-axis direction and the fastening portion 2121 overlaps or is in contact with the pair of separation preventing members of the third display apparatus, the first display apparatus 100 may be coupled or tiled to the third display apparatus and thus prevented from being separated from the third display apparatus.

Meanwhile, the fastening portion 2121 may be formed at a size equal to or smaller than that of the support groove of the third display apparatus so that it may be inserted into the support groove of the third display apparatus. Therefore, the fastening portion 2121 of the first display apparatus 100 may be slid in the X-axis direction to overlap or contact the pair of separation preventing members of the third display apparatus and then positioned in the support groove, after being inserted into the detachable groove of the third display apparatus. Since the third display apparatus may be implemented by the display apparatus 100 (or first display apparatus 100) according to one embodiment of the present disclosure, elements of the third display apparatus may be the same as those of the display apparatus 100 (or first display apparatus 100) according to one embodiment of the present disclosure in view of arrangement, functions and effects.

Referring to FIG. 5B, the recess 2122 may be formed to have a width smaller than that of the fastening portion 2121. The recess 2122 may have a width smaller than that of the fastening portion 2121 so that the fastening portion 2121 of the first display apparatus 100 may be slid and inserted into the support groove of the third display apparatus. Therefore, even though the fastening portion 2121 of the first display apparatus 100 slides in the X-axis direction, since the recess 2122 may not interfere with the pair of separation preventing members 242 of the third display apparatus, the fastening portion 2121 of the first display apparatus 100 may be inserted into the support groove of the third display apparatus, which is provided to be adjacent to the pair of separation preventing members of the third display apparatus. Therefore, in the display apparatus 100 according to one embodiment of the present disclosure, a width CW of the recess 2122 may be smaller than a width PW of the fastening portion 2121. For example, the width CW of the recess 2122 may be equal to or smaller than a distance (or length) of the pair of separation preventing members 242 that are spaced apart from each other in the Z-axis direction.

As shown in FIG. 5B, the power receiving member 250 may be disposed or provided on the second side 212 of the main body 210. In more detail, the power receiving member 250 may be provided in a direction of the lower surface of the fastening portion 2121. The power receiving member 250 is for receiving the power. When the plurality of display apparatuses are coupled to each other, for example, as shown in FIG. 3B, when the fastening portion 2121' of the second display apparatus 100' is coupled to the upper portion (or first side 211) of the first display apparatus 100, the terminal portion 223 of the power transfer member 220 of the first display apparatus 100 may be in contact with the power receiving terminal 251a' of the power receiving member 250' of the second display apparatus 100', whereby the power receiving member 250' of the second display apparatus 100' may receive the power from the first display apparatus 100 or a power supply device connected to the first display apparatus 100. Since the second display apparatus 100' may include a plurality of power receiving members 250', the power receiving terminal 251a' provided in one power receiving member 250a' of the plurality of power receiving members 250' will be described in FIG. 3B by way of example. As a result, as the terminal portion 223 of the first display apparatus 100 is in contact with the power receiving terminal 251a' of the second display apparatus 100', the second display apparatus 100' may be driven by receiving the power, thereby displaying an image.

Referring back to FIG. 3B, a width EW2 of the power receiving terminal 251a' may be equal to or wider than a width EW1 of the terminal portion 223. When the width EW2 of the power receiving terminal 251a' is smaller than the width EW1 of the terminal portion 223, the terminal portion 223 having the degree of freedom and the power receiving terminal 251a' are not well in contact with each other, or a contact area between the terminal portion 223 and the power receiving terminal 251a' is smaller than an area of the upper surface of the terminal portion 223, whereby the power may not be smoothly transferred from the first display apparatus 100 to the second display apparatus 100'. On the other hand, when the width EW2 of the power receiving terminal 251a' is equal to or wider than the width EW1 of the terminal portion 223, since the contact area may be equal to the area of the upper surface of the terminal portion 223, the power may be smoothly transferred from the first display apparatus 100 to the second display apparatus 100'. In addition, when the width EW2 of the power receiving terminal 251a' is wider than the width EW1 of the terminal portion 223, since the terminal portion 223 and the power receiving terminal 251a' may be in contact with each other even though the position of the terminal portion 223 is not exactly matched with that of the power receiving terminal 251a', the power may be transferred from the first display apparatus 100 to the second display apparatus 100'.

Since each of the first display apparatus 100, the second display apparatus 100' and the third display apparatus is implemented as the display apparatus according to one embodiment of the present disclosure, all of the above-described elements may have the same structure and arrangement as those of the elements included in the display apparatus 100 according to one embodiment of the present disclosure, and their effects may be also equally implemented. Therefore, the width EW2 of the power receiving terminal 251a' of the second display apparatus 100' may be equal to the width of the power receiving terminal 251a of the display apparatus 100 according to one embodiment of the present disclosure. Therefore, the width EW2 of the power receiving terminal 251a provided on the second side 212 of the first display apparatus 100 may be equal to or wider than the width EW1 of the terminal portion 223 provided on the first side 211 of the first display apparatus 100.

The display apparatus 100 according to one embodiment of the present disclosure may include a plurality of power receiving members 250. For example, based on FIG. 4, the power receiving member 250 may include a first power receiving member 250a positioned at a left side, and a second power receiving member 250b disposed at a right side to be spaced apart from the first power receiving member 250a. Each of the first power receiving member 250a and the second power receiving member 250b may be disposed at a position corresponding to each of the first power transfer member 220a and the second power transfer member 220b in the Y-axis direction. Therefore, when the first display apparatus 100 and the second display apparatus 100' are coupled to each other or tiled up and down, each of the first power transfer member 220a and the second power transfer member 220b of the first display apparatus 100 may be in contact with each of the first power receiving member 250a' and the second power receiving member (not shown) of the second display apparatus 100', whereby the power may be transferred from the first display apparatus 100 to the second display apparatus 100'.

Referring to FIGS. 4 and 5C, in the display apparatus 100 according to one embodiment of the present disclosure, the main body 210 may include a third side 213.

The third side 213 of the main body 210 is a surface that connects one side of the first side 211 of the main body 210 with one side of the second side 212 of the main body 210. The third side 213 of the main body 210 may refer to a side positioned at the left side based on FIG. 4. The third side 213 of the main body 210 may include a protrusion 2131.

The protrusion 2131 is for coupling the plurality of display apparatuses 100 in a left and right direction. Since the first side 211 and the second side 212 are positioned on the upper and lower sides of the main body 210, the fastening portion 2121' formed on the second side 212' of the second display apparatus may be coupled to the support groove 243 formed on the first side 211 of the first display apparatus when the plurality of display apparatuses 100 are coupled to each other up and down, whereby the first display apparatus and the second display apparatus may be coupled to each other. However, since the protrusion 2131 is positioned at the left side of the main body 210, the protrusion 2131 may be used to couple the plurality of display apparatuses 100 in the left and right directions.

The protrusion 2131 may be formed to be protruded in the thickness direction of the main body 210, that is, a direction perpendicular to the Z-axis direction. The protrusion 2131 according to an example may be formed to be protruded from the main body 210 in the X-axis direction based on FIG. 4. As shown in FIG. 5C, a thickness T1 of the protrusion 2131 may be thinner than a thickness T2 of the main body 210. This is to allow the protrusion 2131 positioned at the left side of the main body 210 to be inserted into the right side of the display apparatus (or fourth display apparatus) coupled or tiled at the left side. For example, as shown in FIG. 5D, a recess groove may be formed on the right side of the fourth display apparatus coupled or tiled at the left side, and the protrusion 2131 of the display apparatus 100 according to one embodiment of the present disclosure, that is, the first display apparatus 100, may be inserted into the recess groove. Therefore, the first display apparatus 100 and the fourth display apparatus may be coupled to each other in the left and right direction through the protrusion 2131 of the first display apparatus 100 and the recess groove of the fourth display apparatus, and by this configuration, the first display apparatus 100 and the fourth display apparatus may be supported by each other.

Referring to FIGS. 4 and 5D, in the display apparatus 100 according to one embodiment of the present disclosure, the main body 210 may include a fourth side 214.

The fourth side 214 of the main body 210 is a surface that connects the other side of the first side 211 of the main body 210 with the other side of the second side 212 of the main body 210. The fourth side 214 of the main body 210 is a surface positioned at the right side based on FIG. 4, and may be disposed in parallel with the third side 213. The fourth side 214 of the main body 210 may include a recess groove 2141.

The recess groove 2141 is for inserting the protrusion 2131. In this case, the protrusion 2131 may be a protruding portion of another display apparatus (or fifth display apparatus) coupled at the right side of the main body 210. As described above, since the protrusion 2131 is positioned at the left side of the main body 210, the recess groove 2141 may be formed on the fourth side 214 positioned at the right side of the main body 210.

The recess groove 2141 may be formed to be recessed in the thickness direction of the main body 210, that is, a direction perpendicular to the Z-axis direction. The recess groove 2141 may be formed to be recessed in the X-axis direction from the main body 210 based on FIG. 4. The recess groove 2141 may be formed to have a width equal to or greater than the thickness T1 of the protrusion 2131 so that the protrusion 2131 may be inserted thereinto. When the width of the recess groove 2141 is equal to the thickness T1 of the protrusion 2131, the recess groove 2141 of the first display apparatus 100 and the protrusion of the fifth display apparatus may be accurately coupled to each other without a gap, whereby a coupling force between the first display apparatus 100 and the fifth display apparatus with respect to an external impact may be improved. In addition, a recessed depth of the recess groove 2141 may be equal to or deeper than the protruded length of the protrusion 2131. Since the protrusion 2131 is not completely inserted into the recess groove 2141 when the recessed depth of the recess groove 2141 is shorter than or shallower than the protruded length of the protrusion 2131, a gap may be formed between the first display apparatus 100 and the fourth display apparatus to generate a seam.

As a result, the display apparatus 100 (or first display apparatus 100) according to one embodiment of the present disclosure may transfer the power to the second display apparatus coupled or tiled at the upper side through the power transfer member 220 provided on the first side 211, may receive the power from the third display apparatus (not shown), which is coupled or tiled at the lower side, or a stand frame through the power receiving member 250 provided on the second side 212, may be coupled or tiled to the fourth display apparatus (not shown) in a left direction through the protrusion 2131 provided on the third side 213, and may be provided so that the fifth display apparatus (not shown) may be coupled or tiled at the right side through the recess groove 2141 provided on the fourth side 214. That is, the display apparatus 100 according to one embodiment of the present disclosure may be implemented so that another display apparatus may be easily coupled thereto in the left and right direction.

Based on the first display apparatus 100, a display apparatus coupled at the upper side may be the second display apparatus 100', a display apparatus coupled at the lower side may be the third display apparatus, a display apparatus coupled at the left side may be the fourth display apparatus, and a display apparatus coupled at the right side may be the fifth display apparatus. Since each of the first display apparatus 100 and the second to fifth display apparatuses may be implemented as the display apparatus according to one embodiment of the present disclosure, the elements of the second to fifth display apparatuses may have the same arrangement, functions and effect as those of the elements of the first display apparatus 100.

Figure 6A:
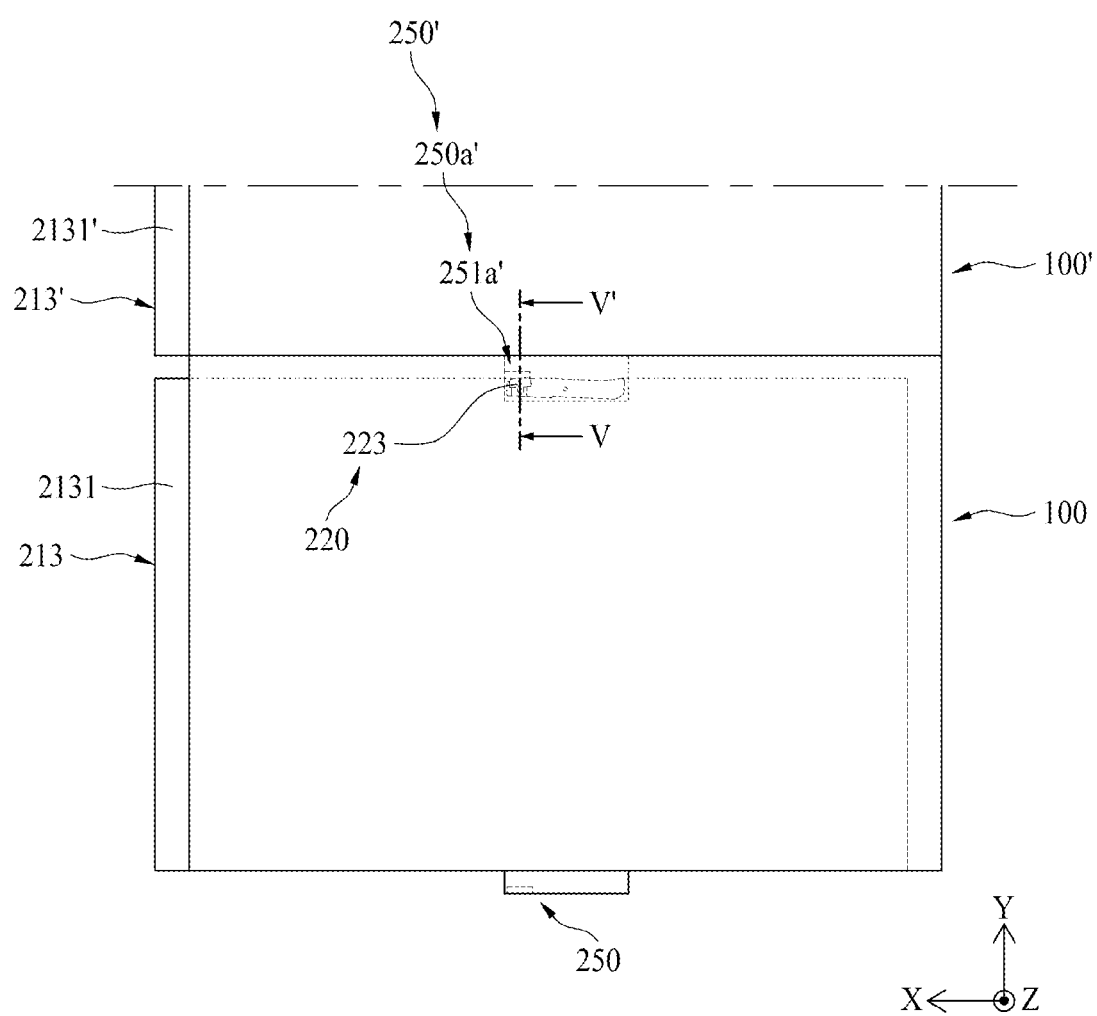
FIG. 6A is a schematic front view illustrating that a plurality of display apparatuses according to another embodiment of the present disclosure are coupled to each other.
Figure 6B:
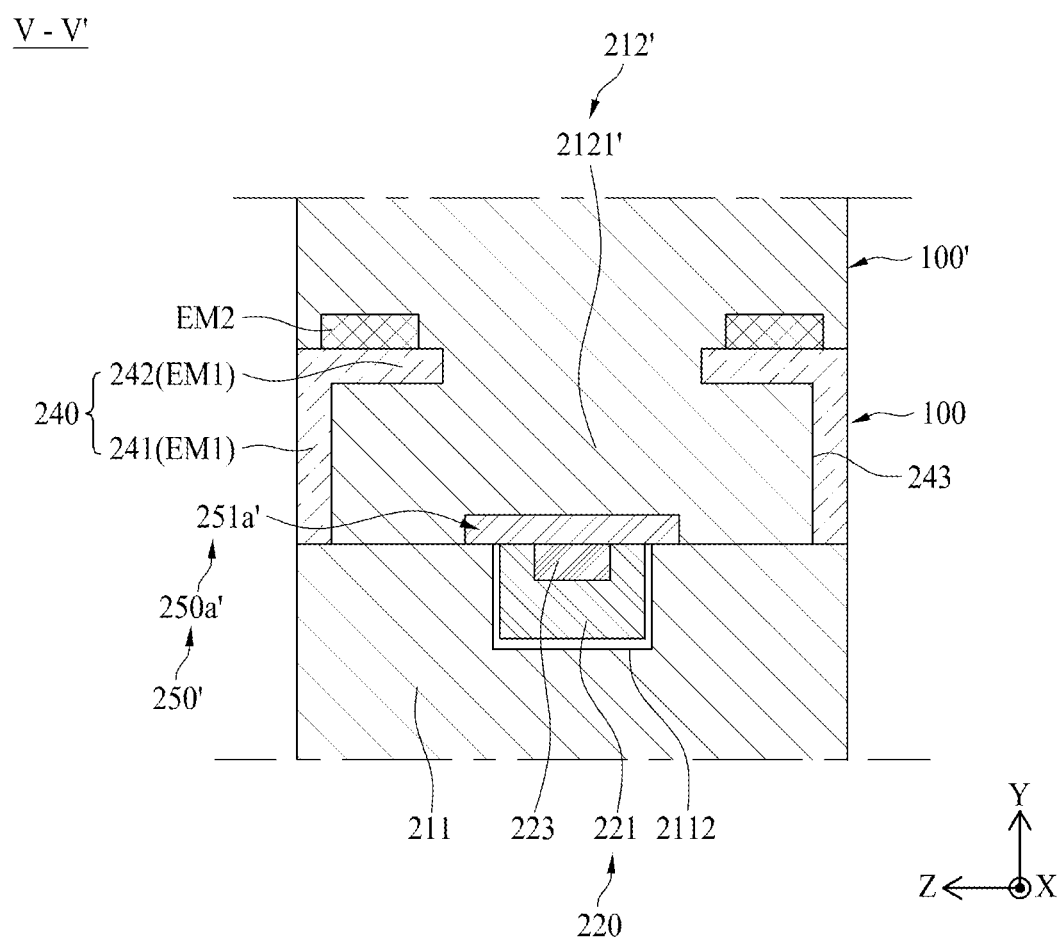
FIG. 6B is a schematic cross-sectional view taken along line V-V' shown in FIG. 6A.

FIG. 6A is a schematic front view illustrating that a plurality of display apparatuses according to another embodiment of the present disclosure are coupled to each other, and FIG. 6B is a schematic cross-sectional view taken along line V-V' shown in FIG. 6A.

Referring to FIGS. 6A and 6B, the display apparatus according to another embodiment of the present disclosure is the same as the display apparatus of FIG. 2 except that only one power transfer member 220 is provided and the support 240 and the second side 212 of the main body 210 are changed. Therefore, the same reference numerals will be given to the same elements, and the following description will be based on a difference configuration from the display apparatus of FIG. 2.

In case of the display apparatus shown in FIG. 2, the support member 200 includes a plurality of power transfer members 220, for example, a first power transfer member 220a and a second power transfer member 220b, as shown in FIG. 4. Therefore, the display apparatus of FIG. 2 may transfer the positive voltage to another display apparatus (or second display apparatus 100') through the first power transfer member 220a, and may transfer the negative voltage to another display apparatus (or second display apparatus 100') through the second power transfer member 220b. That is, the display apparatus of FIG. 2 may transfer different voltages to another display apparatus (or second display apparatus 100'), which is coupled or tiled at the upper side, through the first power transfer member 220a and the second power transfer member 220b. In this case, the support member 200 of the first display apparatus 100 may be a first support member and the support 240 of the first display apparatus 100 may be the first support. And, a support member of another display apparatus (or the second display apparatus 100') may be a second support member and a support 240 of another display apparatus (or the second display apparatus 100') may be the second support.

On the other hand, in case of the display apparatus according to FIG. 6A, only one power transfer member 220 is provided, at least a portion of the support 240 (or the first support) is made of a conductive material EM1, and at least a portion of the second side 212 of the main body 210 is made of a conductive material EM2 so as to be electrically connected to the support 240 (or the second support of another display apparatus) made of the conductive material EM1. In this case, the second side 212 of the main body 210 made of the conductive material EM2 may be the second side 212' of another display apparatus (or second display apparatus 100').

In more detail, as shown in FIG. 6B, the pair of guide members 241 and the pair of separation preventing members 242 of the support 240 of the first display apparatus 100 may all be made of the conductive material EM1. Therefore, the support 240 of the first display apparatus 100 may include a pair of guide members 241 EM1 and a pair of separation preventing members 242 EM1, which are all made of a conductive material. In this case, the second side 212' of the second display apparatus 100' that is in contact with the pair of separation preventing members 242 EM1 may be made of the conductive material EM2 to receive the power. Therefore, after the fastening portion 2121' of the second display apparatus 100' is inserted into the support groove 243 (or detachable groove H) of the first display apparatus 100 and slid, when the pair of separation preventing members 242 EM1 of the first display apparatus 100 are in contact with the second side 212' of the second display apparatus 100', which is made of the conductive material EM2, the negative voltage may be transferred from the first display apparatus 100 to the second display apparatus 100'. As shown in FIG. 6B, when the terminal portion 223 of the first display apparatus 100 and the power receiving terminal 251a' of the second display apparatus 100' are in contact with each other, the positive voltage may be transferred from the first display apparatus 100 to the second display apparatus 100'.

As shown in FIG. 6B, the pair of separation preventing members 242 EM1 and the pair of guide members 241 EM1 of the first display apparatus 100 are spaced apart from the power receiving terminal 251a' (or power transfer member 220 of the first display apparatus 100) of the second display apparatus 100', and thus may transfer or receive their respective voltages (or power) different from each other.

Although not shown, at least one of the pair of separation preventing members 242 EM1 and the pair of guide members 241 EM1, which are made of the conductive material EM1, in the first display apparatus 100 may be connected to a portion, which is made of the conductive material EM2 on the second side 212 of the main body 210, through a line (or conductive tape), but is not limited thereto. In the first display apparatus 100, at least one of the pair of separation preventing members 242 EM1 or the pair of guide members 241 EM1, which are made of the conductive material EM1, may be connected to a driving circuit disposed in the storage 210a through a line (or conductive tape). Therefore, in the first display apparatus 100, at least one of the pair of separation preventing members 242 EM1 or the pair of guide members 241 EM1, which are made of the conductive material EM1, may receive the power from the portion of the second side 212, which is made of the conductive material EM2, or the driving circuit and transfer the power to another display apparatus (or second display apparatus 100'). In this case, the power transferred from at least one of the pair of separation preventing members 242 EM1 or the pair of guide members 241 EM1 may be a voltage different from a voltage transferred by the power transfer member 220.

As a result, the display apparatus according to FIG. 6A may transfer the positive voltage to another display apparatus (or second display apparatus 100') through the power transfer member 220, and may transfer the negative voltage to another display apparatus (or second display apparatus 100') through the support 240 made of the conductive material EM1, but is not limited thereto. The power transfer member 220 of the first display apparatus 100 may be provided to transfer the negative voltage, and the support 240 made of the conductive material EM1 may be provided to transfer the positive voltage. That is, the display apparatus 100 according to another embodiment of the present disclosure may be provided so that the power transfer member 220 and the support 240 made of the conductive material EM1 may transfer their respective voltages (or power) different from each other.

Although FIG. 6B shows that the pair of separation preventing members 242 EM1 and the pair of guide members 241 EM1 are all made of the conductive material EM1, but the present disclosure is not limited thereto. Only one of the pair of separation preventing members 242 EM1 and the pair of guide members 241 EM1 may be made of the conductive material. In this case, only an element made of the conductive material EM1 may be connected to the portion of the second side 212, which is made of the conductive material EM2, through a line (or conductive tape), or may be connected to the driving circuit.

In the present disclosure, at least a portion of the support 240 is made of a conductive material, but is not limited thereto. If a voltage (or power) different from that of the power transfer member 220 may be transferred, another element of the main body 210, for example, at least a portion of the protrusion 2131 provided on the third side 213 and at least a portion of the fourth side 214 that is in contact with a protrusion of another display apparatus may be made of a conductive material. In addition, if the voltage (or power) may be transferred, the above elements may be provided to partially include a conductive material without being made of the conductive material.

Meanwhile, in case of the display apparatus 100 according to another embodiment of the present disclosure, since only one power transfer member 220 is provided, only one power receiving member 250 may be provided at a position corresponding to the power transfer member 220 in the Y-axis direction. Since the power transfer member 220 and the power receiving member 250 are connected to each other through a line (or conductive tape), the voltage (or power) transferred through the power transfer member 220 and the voltage (or power) supplied through the power receiving member 250 may be the same as each other. The power transfer member 220 according to another example may be connected to the driving circuit disposed in the storage 210a through a line (or conductive tape) to receive the power from the driving circuit.

In addition, in case of the display apparatus 100 according to another embodiment of the present disclosure, since only one power transfer member 220 is provided, the degree of freedom in arrangement of the power transfer member 220 provided on the first side 211 may be improved. For example, as shown in FIG. 6A, one power transfer member 220 may be positioned at the center in the X-axis direction on the first side 211.

When the power transfer member 220 is positioned at the center of the first side 211, the pair of separation preventing members 242 of the support 240 may also be positioned at the center of the first side 211. Therefore, the support 240 of the first display apparatus 100 and the fastening portion 2121' of the second display apparatus 100' may be coupled to each other at the center of the first side 211 of the first display apparatus 100, and the power transfer member 220 of the first display apparatus 100 and the power receiving member 250a' of the second display apparatus 100' may be in contact with each other at the center of the first side 211 of the first display apparatus 100.

As the support 240 of the first display apparatus 100 and the fastening portion 2121' of the second display apparatus 100' are coupled to each other at the center of the first side 211 of the first display apparatus 100, an external impact generated from the left or right side may be received more uniformly than the case that the support 240 of the first display apparatus 100 and the fastening portion 2121' of the second display apparatus 100' are coupled to each other at another position not the center of the first side 211, whereby at least one of the first display apparatus 100 or the second display apparatus 100' may be further prevented from being separated due to the external impact from the left or right side.

Since the first display apparatus 100 and the second display apparatus 100' are only shown in FIG. 6A, the protrusion 2131 may be disposed on the third side 213, which is the left side of the first display apparatus 100. Likewise, a protrusion 2131' may also be disposed on a third side 213' of the second display apparatus 100'. However, the protrusions 2131 and 2131' may be removed to improve the aesthetic sense when another display apparatus at the left side, for example, the fourth display apparatus is not coupled or tiled.

Figure 7:
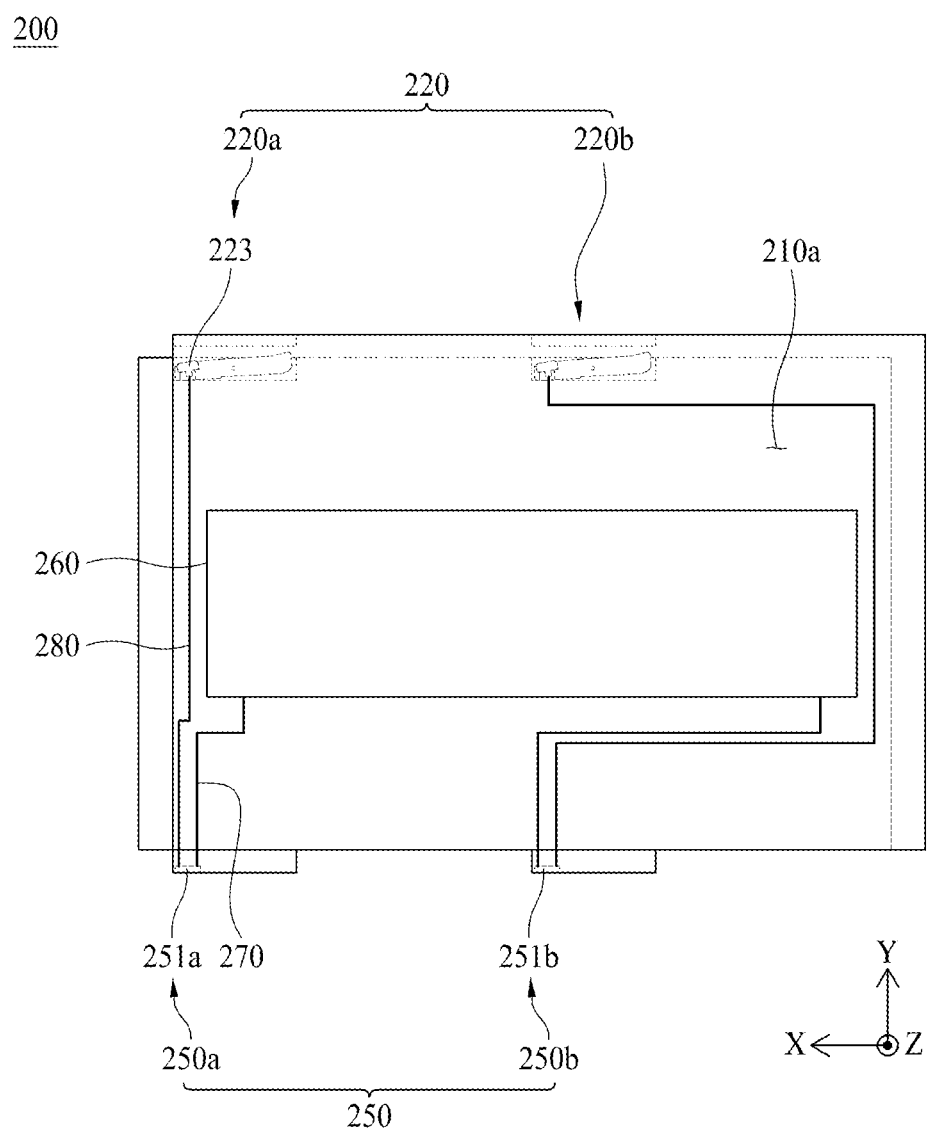
FIG. 7 is a schematic front view illustrating an inner structure of a support member of FIG. 4.

FIG. 7 is a schematic front view illustrating an inner structure of a support member of FIG. 4.

The display apparatus 100 according to one embodiment of the present disclosure may include an individual driving circuit 260, a first connector 270 and a second connector 280.

The individual driving circuit 260 is to drive the display panel 110 coupled to the front surface of the support member 200. The individual driving circuit 260 according to an example may be a printed circuit board PCB. The individual driving circuit 260 may be disposed in the storage 210a formed in the main body 210. As shown in FIG. 7, the individual driving circuit 260 according to an example may be disposed in the storage 210a and thus positioned between the power transfer member 220 and the power receiving member 250. The individual driving circuit 260 may be operated by being supplied with the power from the power receiving member 250. For example, the individual driving circuit 260 may be operated by being supplied with the positive voltage from the first power receiving terminal 251a of the first power receiving member 250a and a negative voltage from the second power receiving terminal 251b of the second power receiving member 250b.

The first connector 270 is to connect the individual driving circuit 260 with the power receiving member 250. The first connector 270 may be a line, but is not limited thereto. The first connector 270 may be an element having conductivity, such as a conductive tape, if the voltage (or power) supplied by the power receiving member 250 may be transferred to the individual driving circuit 260. As shown in FIG. 7, the first connector 270 according to an example may include a line for connecting the first power receiving terminal 251a with the individual driving circuit 260 to transfer a positive voltage and a line for connecting the second power receiving terminal 251b with the individual driving circuit 260 to transfer a negative voltage. Therefore, the individual driving circuit 260 may be connected to the first power receiving terminal 251a and the second power receiving terminal 251b through the first connector 270 to receive the positive voltage and the negative voltage, thereby driving the display panel 110.

The second connector 280 is to connect the power receiving member 250 and the power transfer member 220. Since the power transfer member 220 is directly connected to the power receiving member 250 through the second connector 280, the power transfer member 220 may directly receive the voltage (or power) supplied to the power receiving member 250 through the second connector 280 and transfer the received voltage (or power) to another display apparatus (or second display apparatus 100') coupled or tiled at the first side 211. The second connector 280 may be a line, but is not limited thereto. The second connector 280 may be an element having conductivity, such as a conductive tape, if the voltage (or power) supplied by the power receiving member 250 may be transferred to the power receiving member of another display apparatus (or second display apparatus 100'). As shown in FIG. 7, the second connector 280 according to an example may include a line for connecting the first power receiving terminal 251a with the power receiving terminal 223 of the first power transfer member 220a to transfer the positive voltage and a line for connecting the second power receiving terminal 251b with the power receiving terminal of the second power transfer member 220b to transfer the negative voltage. Therefore, each of the first power transfer member 220a and the second power transfer member 220b, which are provided on the first side 211 of the main body 210, may be directly connected to each of the first power receiving terminal 251a and the second power receiving terminal 251b through the second connector 280 to receive the positive voltage and the negative voltage, thereby transferring the voltage to another display apparatus (or second display apparatus 100') coupled or tiled at the first side 211. Although each of the first power transfer member 220a and the second power transfer member 220b is described to be directly connected to each of the first power receiving terminal 251a and the second power receiving terminal 251b through the second connector 280, the present disclosure is not limited thereto. Each of the first power transfer member 220a and the second power transfer member 220b may be connected to the individual driving circuit 260 through a third connector (not shown) to indirectly receive the power supplied to the individual driving circuit 260.

Figure 8:
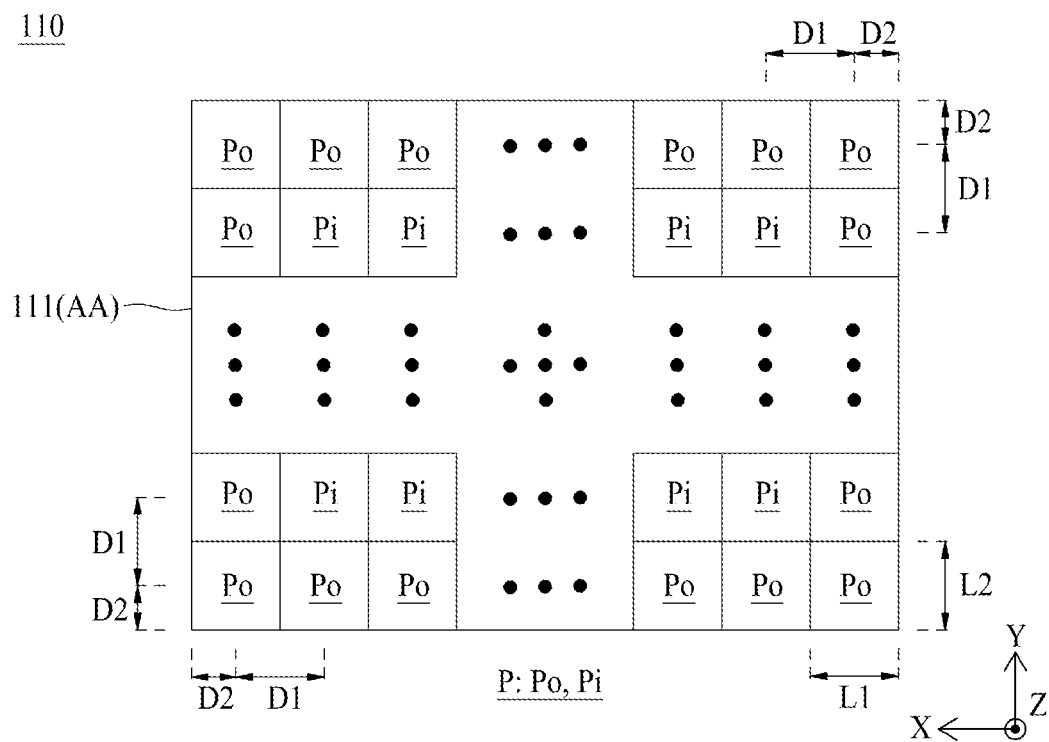
FIG. 8 is a schematic front view illustrating a display apparatus according to one embodiment of the present disclosure.
Figure 9:
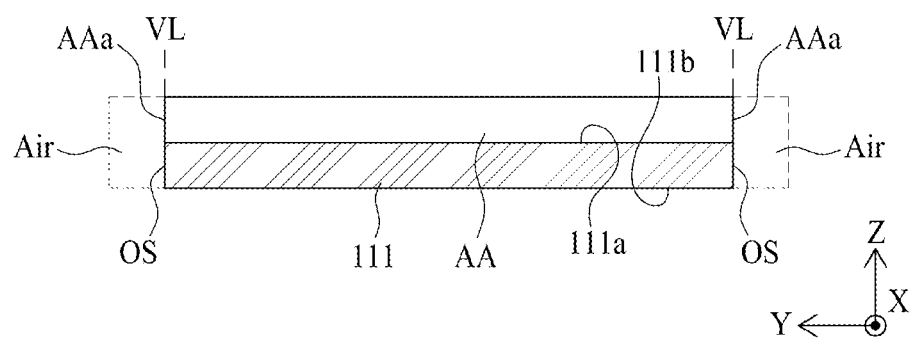
FIG. 9 is a schematic side view illustrating a display apparatus according to one embodiment of the present disclosure.
Figure 10A:
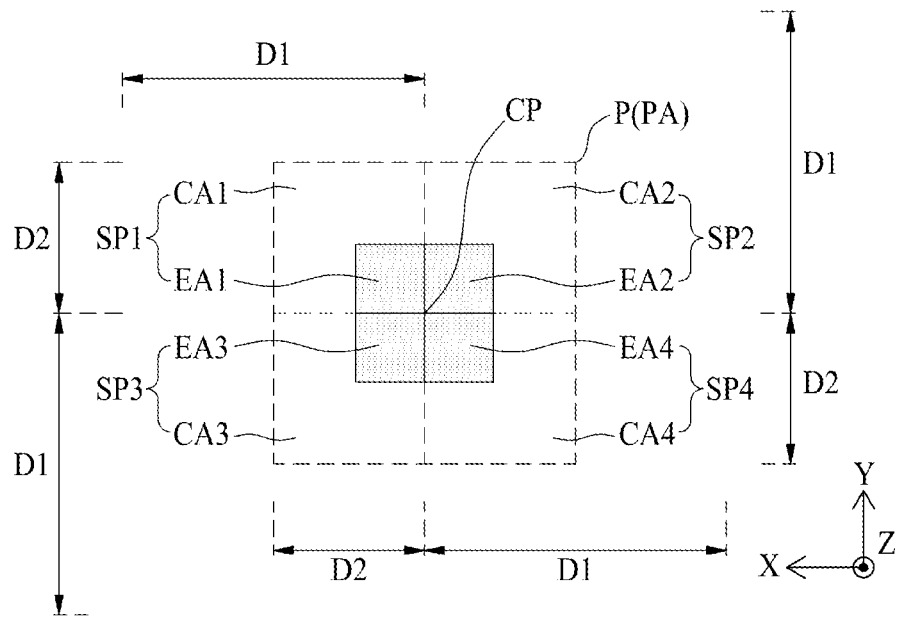
FIG. 10A is a view illustrating one pixel according to one example shown in FIG. 8.
Figure 10B:
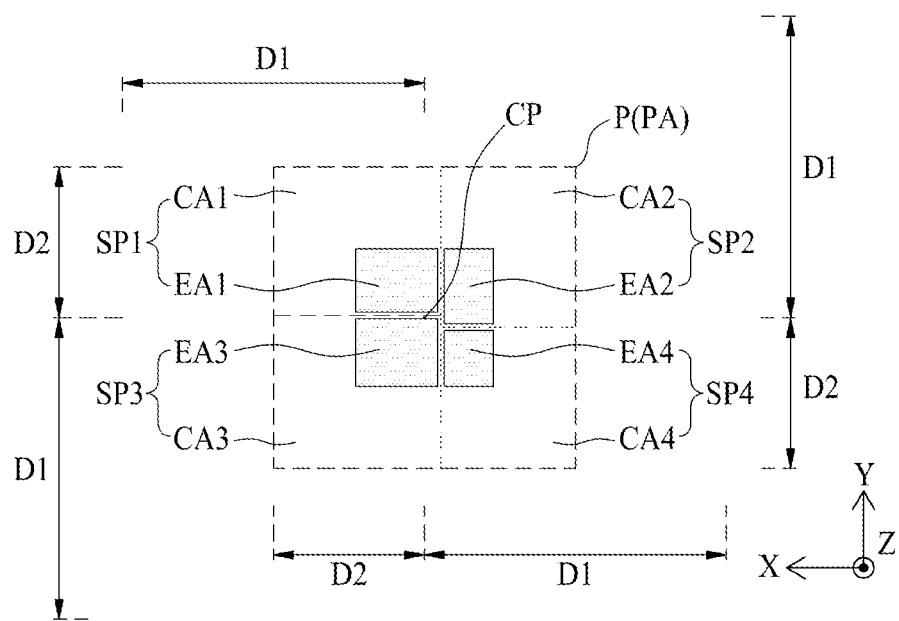
FIG. 10B is a view illustrating one pixel according to another example shown in FIG. 8.

FIG. 8 is a schematic front view illustrating a display apparatus according to one embodiment of the present disclosure, FIG. 9 is a schematic side view illustrating a display apparatus according to one embodiment of the present disclosure, FIG. 10A is a view illustrating one pixel according to one example shown in FIG. 8, and FIG. 10B is a view illustrating one pixel according to another example shown in FIG. 8

Referring to FIGS. 8 and 9, in the display apparatus 100 according to an embodiment of the present disclosure, the display panel 110 may include a substrate 111 having a display portion AA, and a plurality of pixels P formed on the display portion AA of the substrate 111.

The substrate 111 may be expressed as a first substrate, a base substrate, or a pixel array substrate. For example, the substrate 111 may be a glass substrate, a bendable thin glass substrate, or a plastic substrate.

The substrate 111 according to an example may include a first surface 111a, a second surface 111b, and an outer surface OS. The first surface 111a of the substrate 111 may be defined as a front surface, an upper surface, or an upper side surface facing the front of the display apparatus. Here, the first surface 111a of the substrate 111 may be the front surface of the display panel 110. The second surface 111b of the substrate 111 may be defined as a back surface, a rear surface, a lower surface, or a lower side surface facing the rear of the display apparatus. Here, the second surface 111b of the substrate 111 may be the rear surface of the display panel 110. The outer surface OS of the substrate 111 may be defined as a side, a side surface, or a side wall exposed to the air while facing a lateral surface of the display apparatus.

The display portion AA may be expressed an area where an image is displayed and may be expressed as an active portion, an active region, or a display region. A size of the display portion AA may be the same as the size of the substrate (or display apparatus) 111. For example, the size of the display portion AA may be the same as the overall size of the first surface 111a of the substrate 111. Accordingly, the display portion AA is implemented (or disposed) on the entire front surface of the substrate 111 so that the substrate 111 does not include a non-display region is provided along the edge of the first surface 111a to surround the entire display portion AA. Accordingly, the entire front surface of the display apparatus may implement the display portion AA.

The end (or outermost) AAa of the display portion AA may overlap an outer surface OS of the substrate 111 or may be aligned with the outer surface OS of the substrate 111. For example, based on the thickness direction (third direction (Z-axis direction)) of the display apparatus, the lateral surface AAa of the display portion AA may be aligned with an extended vertical extension line VL perpendicular to the outer surface OS of the substrate 111. The lateral surface AAa of the display portion AA may be surrounded only by air without being surrounded by a separate mechanism. That is, all of the lateral surfaces AAa of the display portion AA may have a structure in direct contact with air without being surrounded by a separate mechanism. Accordingly, since the outer surface OS of the substrate 111 corresponding to the end AAa of the display portion AA is surrounded only by air, the display apparatus 100 according to the embodiment of the present disclosure may have an air-bezel structure in which the end AAa of the display portion AA is surrounded by air instead of an opaque non-display region or a structure without a bezel.

The plurality of pixels P may be arranged (or disposed) to have a first interval D1 on the display portion AA of the substrate 111 in each of the first direction (X-axis direction) and the second direction (Y-axis direction). The first direction (X-axis direction) may be a horizontal direction, or a first longitudinal direction (e.g., a horizontal longitudinal direction) of the substrate 111 or the display apparatus. The second direction (Y-axis direction) may be a vertical direction or may be a second longitudinal direction (e.g., a vertical longitudinal direction) of the substrate 111 or the display apparatus.

Each of the plurality of pixels P may be implemented on a plurality of pixel regions defined on the display portion AA of the substrate 111. Each of the plurality of pixel regions may have a first length L1 parallel to the first direction (X-axis direction) and a second length L2 parallel to the second direction (Y-axis direction). The first length L1 may be equal to the second length L2 or may be equal to the first interval D1. Each of the first length L1 and the second length L2 may be equal to the first interval D1. Accordingly, the plurality of pixels P may all have the same size. For example, the first length L1 may be expressed as a first width, a horizontal length, or a horizontal width. The second length L2 may be expressed as a second width, a vertical length, or a vertical width.

Two pixels P adjacent in each of the first direction (X-axis direction) and the second direction (Y-axis direction) may have the same first interval D1 within an error range in the manufacturing process. The first interval D1 may be a pitch (or pixel pitch) between two adjacent pixels P. For example, the first distance D1 may be the shortest distance (or the shortest length) between the centers of each of the two adjacent pixels P. Optionally, the pixel pitch may be a size between one end and the other end of the pixel P parallel to the first direction (X-axis direction). Also, in another example, the pixel pitch may be expressed as a size between one end and the other end of the pixel P parallel to the second direction (Y-axis direction).

Each of the plurality of pixels P may include a circuit layer including a pixel circuit implemented in a pixel region on the substrate 111 and a light emitting device layer disposed on the circuit layer and connected to the pixel circuit. The pixel circuit outputs a data current corresponding to a data signal in response to a data signal and a scan signal supplied from pixel driving lines disposed in the pixel region. The light emitting device layer may include a light emitting layer that emits light by the data current supplied from the pixel circuit.

The plurality of pixels P may be divided into outermost pixels Po and internal pixels Pi.

The outermost pixels Po (or the first pixels) may be pixels disposed closest to the outer surface OS of the substrate 111 among the plurality of pixels P. For example, the outermost pixels Po may be expressed as first pixels.

The second distance D2 between the center of the outermost pixels Po and the outer surface OS of the substrate 111 may be half or less than half the first distance D1. For example, the second distance D2 may be the shortest distance (or the shortest length) between the center of the outermost pixels Po and the outer surface OS of the substrate 111.

When the second interval D2 exceeds half of the first interval D1, the substrate 111 have a larger size than the display portion AA by a difference between the half of the first interval D1 and the second interval D2, and therefore, the region between the end of the outermost pixel Po and the outer surface OS of the substrate 111 may be configured as a non-display region surrounding the entire display portion AA. For example, when the second interval D2 exceeds half of the first interval D1, the substrate 111 inevitably includes a bezel region according to the non-display region surrounding the entire display region AA. Therefore, when the plurality of display panels 110 are disposed adjacent to each other, the sum of the second intervals D2 of each of the two substrates 111 is greater than the first interval D1, so that the sum of the second interval D2 of each of the two substrates 111 is greater than the sum (or seam) of the bezel region of each substrate 111 and may be recognized by the user.

Meanwhile, when the second interval D2 is half or less than half the first interval D1, the end of the outermost pixel Po may be aligned with the outer surface OS of the substrate 111 or the end AAa of the display portion AA may be aligned with the outer surface OS of the substrate 111, and thus the display portion AA may be implemented (or disposed) on the entire surface of the substrate 111. Accordingly, even if a plurality of display panels 110 according to an embodiment of the present disclosure are disposed adjacently, a seam may not be recognized by a user.

The internal pixels Pi may be pixels other than the outermost pixels Po among the plurality of pixels P or pixels surrounded by the outermost pixels Po among the plurality of pixels P. The internal pixels Pi may be represented by second pixels. These internal pixels Pi may be implemented in a configuration or structure different from that of the outermost pixel Po.

Referring to FIGS. 8 and 10A, one pixel P according to an embodiment of the present disclosure may include first to fourth sub-pixels SP1, SP2, SP3, and SP4 disposed in the pixel region PA.

The first sub-pixel SP1 may be disposed in a first subpixel region of the pixel region PA, the second sub-pixel SP2 may be disposed in a second sub-pixel region of the pixel region PA, the third subpixel SP3 may be disposed in a third subpixel region of the pixel region PA, and the fourth subpixel SP4 may be disposed in a fourth subpixel region of the pixel region PA.

As an example, the first subpixel SP1 may be implemented to emit light of a first color, the second subpixel SP2 may be implemented to emit light of a second color, the third subpixel SP3 may be implemented to emit light of a third color, and the fourth sub-pixel SP4 may be implemented to emit light of the fourth color. Each of the first to fourth colors may be different. For example, the first color may be red, the second color may be blue, the third color may be white, and the fourth color may be green.

As another example, some of the first to fourth colors may be the same. For example, the first color may be red, the second color may be first green, the third color may be second green, and the fourth color may be blue.

Each of the first to fourth sub-pixels SP1, SP2, SP3, and SP4 may include light emitting region EA1, EA2, EA3, and EA4 and circuit regions CA1, CA2, CA3, and CA4.

The light emitting regions EA1, EA2, EA3, and EA4 may be disposed to be shifted toward the center CP of the pixel P in the sub-pixel region. For example, the light emitting regions EA1, EA2, EA3, and EA4 may be expressed as an opening region, an opening, or a light emitting portion.

According to an example, the light emitting regions EA1, EA2, EA3, and EA4 of each of the first to fourth sub-pixels SP1, SP2, SP3, and SP4 may have the same size. For example, each of the light emitting regions EA1, EA2, EA3, and EA4 of the first to fourth subpixels SP1, SP2, SP3, and SP4 may have a uniform quad structure or a uniform stripe structure. For example, the light emitting regions EA1, EA2, EA3, and EA4 having a uniform quad structure or a uniform stripe structure may have a size smaller than a quadrant size of the pixel P and may be disposed to be shifted toward CP in the sub-pixel region or may be disposed to be concentrated in the central portion CP of the pixel P.

Referring to FIGS. 8 and 10B, the light emitting regions EA1, EA2, EA3, and EA4 of each of the first to fourth subpixels SP1, SP2, SP3, and SP4 according to another example may have different sizes. For example, each of the light emitting regions EA1, EA2, EA3, and EA4 of the first to fourth subpixels SP1, SP2, SP3, and SP4 may have a non-uniform quad structure or a non-uniform stripe structure.

The size of each of the first to fourth sub-pixels SP1, SP2, SP3, and SP4 having a non-uniform quad structure (or a non-uniform stripe structure) may be set according to resolution, luminous efficiency, or image quality. As an example, when the light emitting regions EA1, EA2, EA3, and EA4 have an unequal quad structure (or unequal stripe structure), the light emitting region EA4 of the fourth subpixel SP4, among the light emitting regions EA1, EA2, EA3, and EA4 of each of the first to fourth subpixels SP1, SP2, SP3, and SP4 may have the smallest size, and the light emitting region EA3 of the third subpixel SP3 may have the largest size. For example, the light emitting regions EA1, EA2, EA3, and EA4 having a non-uniform quad structure (or a non-uniform stripe structure) may be concentrated around the central portion CP of one pixel P. In one pixel P (or pixel region PA), the central portions of the light emitting regions EA1, EA2, EA3, and EA4 are aligned with the central portion CP of the pixel P or spaced apart from the central portion CP of the pixel P.

The circuit regions CA1, CA2, CA3, and CA4 of each of the first to fourth sub-pixels SP1, SP2, SP3, and SP4 may be disposed around the corresponding light emitting regions EA1, EA2, EA3, and EA4. The circuit regions CA1, CA2, CA3, and CA4 may include a circuit for emitting a corresponding sub-pixel and pixel driving lines. For example, the circuit regions CA1, CA2, CA3, and CA4 may be expressed as a non-light-emitting region, a non-opening region, a non-light-emitting portion, a non-opening portion, or a peripheral portion.

Alternatively, in order to increase an aperture ratio of the sub-pixels SP1, SP2, SP3, and SP4 corresponding to the size of the light emitting regions EA1, EA2, EA3, and EA4 or to reduce a pixel pitch D1 according to high resolution of the pixel P, the light emitting regions EA1, EA2, EA3, and EA4 of each of the first to fourth sub-pixels SP1, SP2, SP3, and SP4 may be extended onto the circuit regions CA1, CA2, CA3, and CA4 so as to overlap some or all of the circuit regions CA1, CA2, CA3, and CA4. For example, the light emitting regions EA1, EA2, EA3, and EA4 of each of the first to fourth subpixels SP1, SP2, SP3 and SP4 may be implemented on the substrate 111 to overlap the corresponding circuit regions CA1, CA2, CA3, and CA4. In this case, the light emitting regions EA1, EA2, EA3, and EA4 may have a size which is the same as or larger than the circuit regions CA1, CA2, CA3, or CA4.

Alternatively, each of the plurality of pixels P according to another example may include first to third sub-pixels SP1, SP2, and SP3.

The light emitting regions EA1, EA2, and EA3 of each of the first to third sub-pixels SP1, SP2, and SP3 may have a rectangular shape having a shorter side parallel to the first direction (X-axis direction) and a longer side parallel to the second direction (Y-axis direction) and may be arranged, for example, in a 1×3 shape or a 1×3 stripe shape. For example, the first subpixel SP1 may be a red subpixel, the second subpixel SP2 may be a blue subpixel, and the third subpixel SP3 may be a green subpixel.

Figure 11:
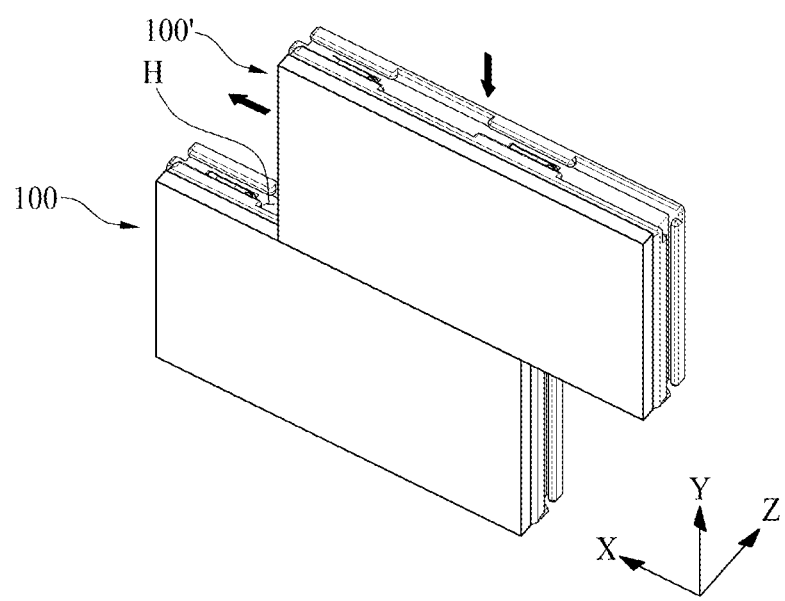
FIG. 11 is a schematic perspective view illustrating an example that a plurality of display apparatuses according to one embodiment of the present disclosure are coupled to each other.

FIG. 11 is a schematic perspective view illustrating an example that a plurality of display apparatuses according to one embodiment of the present disclosure are coupled to each other.

In FIG. 11, the first display apparatus 100 and the second display apparatus 100' coupled to the upper side of the first display apparatus 100, that is, the first side 211 of the first display apparatus 100 are only shown in FIG. 11. As shown in FIG. 11, the second display apparatus 100' may be coupled at the upper side of the first display apparatus 100 in the Y-axis direction and then tiled to the first display apparatus 100 by sliding in the X-axis direction.

In more detail, referring to FIGS. 6B and 11, the fastening portion 2121' of the second display apparatus 100' may be inserted into the detachable groove H of the first display apparatus 100 and then slide in the X-axis direction so as to be inserted into the support groove 243 provided with a pair of separation preventing members 242 of the first display apparatus 100. In FIG. 6B, since the pair of separation preventing members 242 are made of a conductive material EM1 by way of example, when the pair of separation preventing members 242 are not made of a conductive material, a reference numeral 242 EM1 of FIG. 6B may be 242.

As shown in FIG. 6B, as the fastening portion 2121' of the second display apparatus 100' is supported in the pair of separation preventing members 242 of the first display apparatus 100, the second display apparatus 100' may be tiled in the first display apparatus 100 and thus prevented from being separated from the first display apparatus 100. In addition, as the fastening portion 2121' of the second display apparatus 100' is supported in the pair of separation preventing members 242 of the first display apparatus 100, the terminal portion 223 of the first display apparatus 100 may be in contact with the power receiving terminal 251a' of the second display apparatus 100'. Therefore, the power (or voltage) supplied to the first display apparatus 100 may be transferred to the second display apparatus 100' through the terminal portion 223 of the first display apparatus 100 and the power receiving terminal 251a' of the second display apparatus 100'.

When the first display apparatus 100 includes a plurality of power transfer members 220, for example, the first power transfer member 220a and the second power transfer member 220b and the second display apparatus 100' includes a plurality of power receiving members 250', for example, the first power receiving member and the second power receiving member, the positive voltage may be transferred through the first power transfer member 220a of the first display apparatus 100 and the first power receiving member of the second display apparatus 100', and the negative voltage may be transferred through the second power transfer member 220b of the first display apparatus 100 and the second power receiving member of the second display apparatus 100'.

As another example, as shown in FIG. 6B, when the first display apparatus 100 includes one power transfer member 220, the support 240 is made of a conductive material EM1, the second display apparatus 100' includes one power receiving member 250', and a portion of the second side 212' of the second display apparatus 100' is made of a conductive material EM2, the positive voltage may be transferred through the power transfer member 220 of the first display apparatus 100 and the power receiving member 250' of the second display apparatus 100', and the negative voltage may be transferred through the support 240 made of the conductive material EM1 of the first display apparatus 100 and the second side 212' made of the conductive material of the second display apparatus 100'.

Figure 12:
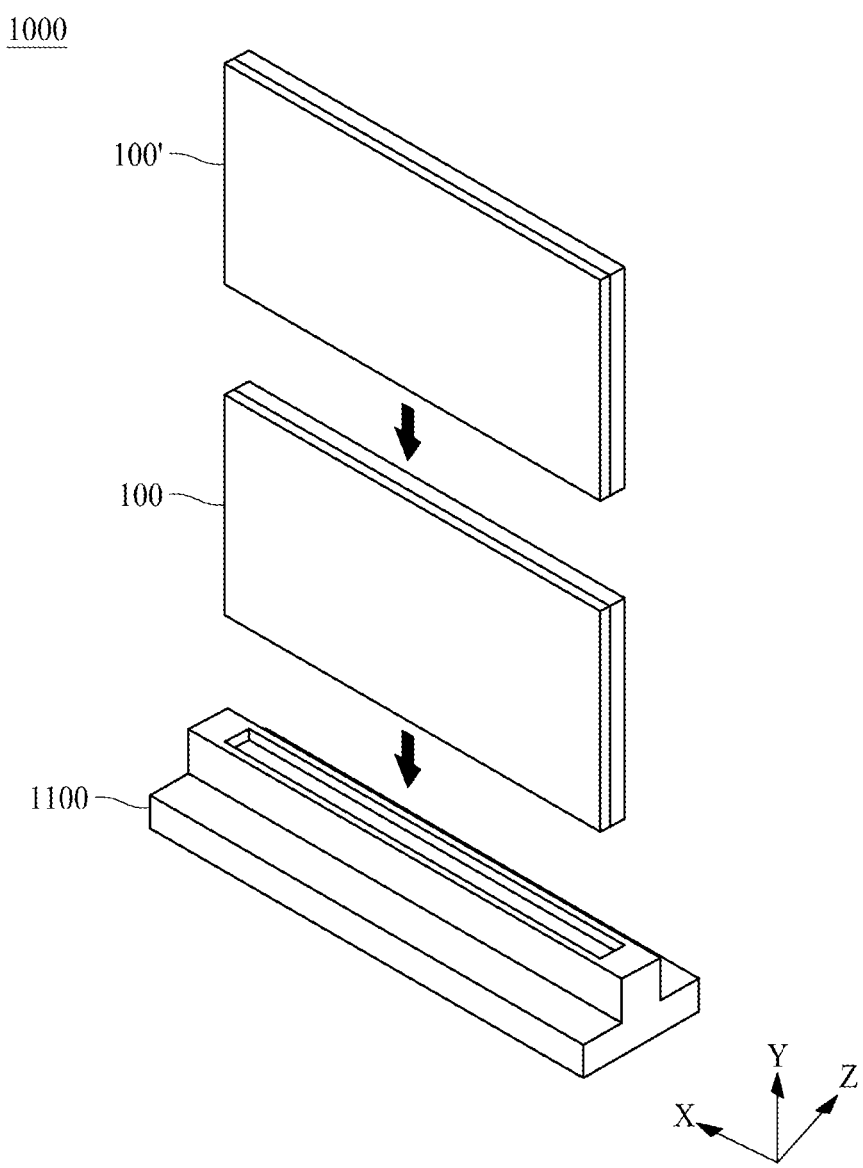
FIG. 12 is a schematic perspective view illustrating that a tiled display apparatus according to one embodiment of the present disclosure is provided.

FIG. 12 is a schematic perspective view illustrating that a tiled display apparatus according to one embodiment of the present disclosure is provided.

Referring to FIG. 12, a tiled display apparatus 1000 according to one embodiment of the present application may include a stand frame 1100 and a plurality of display apparatuses. For example, the plurality of display apparatuses may include a first display apparatus 100 and a second display apparatus 100'. Each of the first display apparatus 100 and the second display apparatus 100' may be implemented as the display apparatus according to one embodiment of the present disclosure. Although FIG. 12 shows that the stand frame 1100, the first display apparatus 100 and the second display apparatus 100' are coupled only in the Y-axis direction in FIG. 12, the stand frame 1100, the first display apparatus 100 and the second display apparatus 100' may be coupled by sliding in the X-axis direction after being coupled in the Y-axis direction as shown in FIG. 11.

The stand frame 1100 may be supported on a floor to support the plurality of display apparatuses. As shown in FIG. 12, the stand frame 1100 may have a cross-section in the Z-axis direction in a shape of '⊥' so that the first display apparatus 100 may be inserted thereinto. The fastening portion 2121 of the first display apparatus 100 may be inserted into the stand frame 1100. Since the power receiving member 250 is provided in the fastening portion 2121, when the fastening portion 2121 of the first display apparatus 100 is inserted into the stand frame 1100, the power receiving member 250 is in contact with a power supply terminal (not shown) connected to the power supply member provided in the stand frame 1100, whereby the first display apparatus 100 may be supplied with the power (or voltage) from the power supply member provided in the stand frame 1100.

Meanwhile, since the power transfer member 220 of the first display apparatus 100 is connected to the power receiving member 250, which is supplied with the power (or voltage) from the power supply member, through the second connector 280, the power transfer member 220 of the first display apparatus 100 may be in contact with the power receiving member 250' of the second display apparatus 100' coupled in the Y-axis direction to transfer the power (voltage).

Therefore, since the tiled display apparatus 1000 according to one embodiment of the present disclosure may supply the voltage (or power) from the stand frame 1100 to the second display apparatus 100' via the first display apparatus 100, a separate power line exposed to the outside may not be required, whereby the esthetic sense may be improved, and the degree of freedom for the installation position of the plurality of display apparatuses may be improved. Also, since the separate power line does not need to be connected to each display apparatus, the time for an installation task may be shortened.

In addition, as the tiled display apparatus 1000 according to one embodiment of the present disclosure is provided so that the support member 200 of each of the plurality of display apparatuses is fastened in a sliding manner, both sides of the support member 200 of each of the plurality of display apparatuses may be aligned in a line in the Y-axis direction as shown in FIG. 6A, and a front surface and a rear surface of the support member 200 of each of the plurality of display apparatuses may be aligned in a line in the Y-axis direction as shown in FIG. 6B. Therefore, since a separate alignment time for aligning the plurality of display apparatuses is not required, the alignment time for the plurality of display apparatuses may be shortened.

Figure 13:
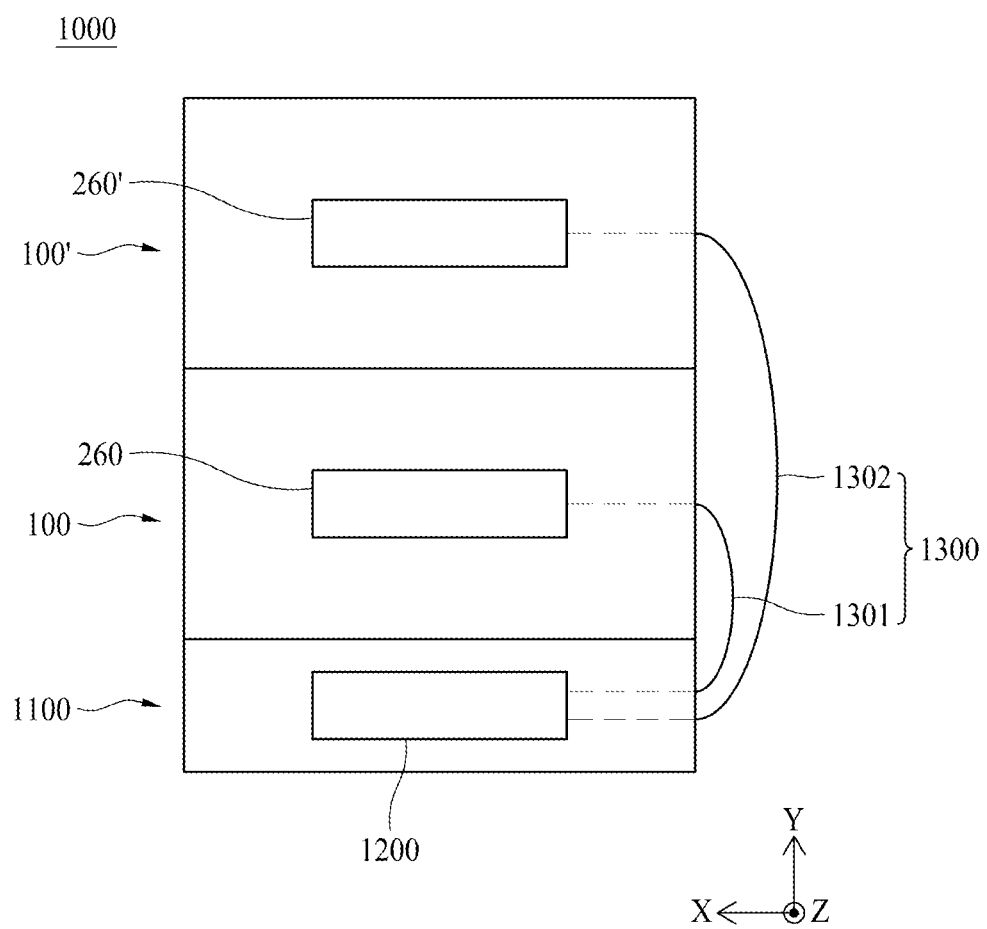
FIG. 13 is a schematic front view illustrating an example of a data transmission structure of a tiled display apparatuses according to one embodiment of the present disclosure.

FIG. 13 is a schematic front view illustrating an example of a data transmission structure of a tiled display apparatuses according to one embodiment of the present disclosure. FIG. 13 is a view schematically illustrating the inside of the tiled display apparatus.

Referring to FIG. 13, in one embodiment of a data transmission structure of the tiled display apparatus according to one embodiment of the present disclosure, the stand frame 1100 may include a control driving circuit 1200 for controlling each of the plurality of display apparatuses. The control driving circuit 1200 may control each of the plurality of display apparatuses 100 and 100' so that the plurality of tiled display apparatuses 100 and 100' may implement an integrated image. The control driving circuit 1200 according to an example may be a control PCB.

Each of the plurality of tiled display apparatuses 100 and 100' may include individual driving circuits 260 and 260'. For example, as shown in FIG. 13, the first display apparatus 100 coupled to the stand frame 1100 may include a first individual driving circuit 260, and the second display apparatus 100' coupled to the upper side of the first display apparatus 100 may include a second individual driving circuit 260'.

The control driving circuit 1200 may be connected to the individual driving circuits 260 and 260' of each of the plurality of display apparatuses 100 and 100' through a plurality of signal connectors 1300. The signal connector 1300 according to an example may be a cable, but is not limited thereto. As shown in FIG. 13, the control driving circuit 1200 may be connected to the first individual driving circuit 260 through a first signal connector 1301. The control driving circuit 1200 may be connected to the second individual driving circuit 260' through a second signal connector 1302. Therefore, the tiled display apparatus 1000 according to one embodiment of the present disclosure may be provided so that the control driving circuit 1200 provided in the stand frame 1100 is connected to each of the individual driving circuits 260 and 260' of each of the plurality of display apparatuses through the plurality of signal connectors 1300, whereby the plurality of display apparatuses may output an integrated image or a partially different image.

In the data transmission structure of the tiled display apparatus according to one embodiment of the present disclosure, since the control driving circuit 1200 is provided only in the stand frame 1100, the degree of freedom in which the individual driving circuit of each of the plurality of display apparatuses is disposed in the storage may be improved.

Figure 14:
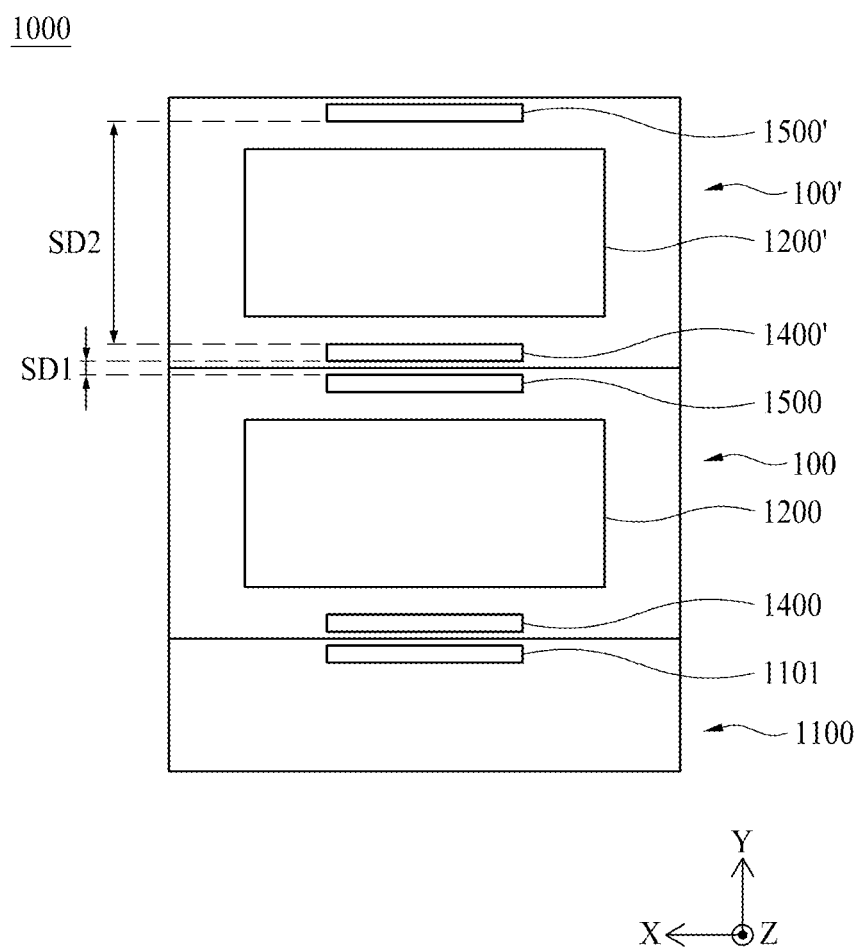
FIG. 14 is a schematic front view illustrating another example of a data transmission structure of a tiled display apparatuses according to one embodiment of the present disclosure.

FIG. 14 is a schematic front view illustrating another example of a data transmission structure of a tiled display apparatuses according to one embodiment of the present disclosure. FIG. 14 is a view schematically illustrating the inside of the tiled display apparatus.

Referring to FIG. 14, another example of a data transmission structure of a tiled display apparatus according to one embodiment of the present disclosure is the same as the data transmission structure of the tiled display apparatus shown in FIG. 13 except that each of the plurality of display apparatuses includes a control driving circuit 1200 and a method of connecting signals of the control driving circuits 1200 of each of the plurality of display apparatuses is changed. Therefore, the same reference numerals will be given to the same elements, and the following description will be based on a difference configuration from the data transmission structure of FIG. 13.

In the tiled display apparatus shown in FIG. 13, as the control driving circuit 1200 provided in the stand frame 1100 is connected to each of the individual driving circuits 260 and 260' of each of the plurality of display apparatuses through the plurality of signal connectors 1300, a signal, such as a data signal, may be transferred from the control driving circuit 1200 to the individual driving circuits 260 and 260', whereby the plurality of display apparatuses may output an integrated image or a partially different image.

On the other hand, in case of the tiled display apparatus shown in FIG. 14, since each of the plurality of display apparatuses includes the control driving circuits 1200 and 1200', no control driving circuit may be provided in the stand frame 1200. Since no control driving circuit is provided in the stand frame 1200, the first display apparatus 100 coupled to the stand frame 1200 may include a signal receiver 1400 to receive a signal transmitted from the stand frame 1200. The stand frame 1200 may transmit a signal to the signal receiver 1400 of the first display apparatus 100 in accordance with a control signal preset by a user. As another example, the stand frame 1200 may receive the control signal preset by the user in a wireless or wired manner and transmit the signal to the signal receiver 1400 of the first display apparatus 100. The stand frame 1200 may include a signal transmitter 1101 for transmitting the signal to the first display apparatus 100.

The signal receiver 1400 of the first display apparatus 100 may be connected to the control driving circuit 1200 through a line, so that the signal received from the signal transmitter 1101 of the stand frame 1100 may be transferred to the control driving circuit 1200. Therefore, the first display apparatus 100 may be driven by the signal received by the control driving circuit 1200.

Meanwhile, the first display apparatus 100 may further include a signal transmitter 1500 for transmitting a signal to the second display apparatus 100' that is tiled at the upper side.

The signal transmitter 1500 may be connected to the control driving circuit 1200 of the first display apparatus 100 through a line, or may be directly connected to the signal receiver 1400 of the first display apparatus 100. Therefore, the signal transmitter 1500 of the first display apparatus 100 may transmit a signal to the signal receiver 1400' of the second display apparatus 100'.

The signal receiver 1400' of the second display apparatus 100' may receive a signal transmitted from the first display apparatus 100 and transfer the signal to the control driving circuit 1200' of the second display apparatus 100'. The signal receiver 1400' of the second display apparatus 100' may be connected to the control driving circuit 1200' through a line in the same manner as the first display apparatus 100, thereby transferring the signal received from the signal transmitter 1500 of the first display apparatus 100 to the control driving circuit 1200'. Therefore, the second display apparatus 100' may be driven by the signal received by the control driving circuit 1200'.

All of the signal transmitter 1101 provided in the stand frame 1100, the signal receiver 1400 and the signal transmitter 1500, which are provided in the first display apparatus 100, and the signal receiver 1400' and the signal transmitter 1500', which are provided in the second display apparatus 100', may receive or transmit signals in a wireless manner.

Therefore, in the tiled display apparatus 1000 of FIG. 14, since a separate signal connection line for connecting the plurality of display apparatuses is not required, the time for an installation task may be shortened. Since there is no signal connection line exposed to the outside of the plurality of display apparatuses, the esthetic sense of external appearance may be improved, and the degree of freedom for the installation position of the plurality of display apparatuses may be improved.

As shown in FIG. 14, the signal receiver and the signal transmitter of each of the plurality of display apparatuses may be spaced apart from each other based on the control driving circuit to allow signals not to interfere with each other. For example, as shown in FIG. 14, the signal receiver 1400 of the first display apparatus 100 may be disposed on one side or a lower portion of the control driving circuit 1200, and the signal transmitter 1500 of the first display apparatus 100 may be disposed on the other side or an upper portion of the control driving circuit 1200. The signal receiver 1400' and the signal transmitter 1500' of the second display apparatus 100' may be disposed in the same structure as that of the first display apparatus 100.

Meanwhile, the tiled display apparatus 1000 according to FIG. 14 may be provided so that a first distance SD1 (or first length SD1) between the signal transmitter 1500 of the first display apparatus 100 and the signal receiver 1400' of the second display apparatus 100' may be shorter than a distance SD2 (or the second length SD2) between the signal receiver 1400' and the signal transmitter 1500' of the second display apparatus 100'. This is to improve a signal reception rate of the signal receiver 1400' of the second display apparatus 100' with respect to the signal transmitted from the signal transmitter 1500 of the first display apparatus 100. In addition, the signal receiver 1400' and the signal transmitter 1500' of the second display apparatus 100' may be spaced apart from each other as much as a second length SD2, whereby signals may be prevented from interfering with each other between the signal receiver 1400' and the signal transmitter 1500'. Therefore, although the tiled display apparatus 1000 according to FIG. 14 is provided to wirelessly transmit and receive signals for controlling the plurality of display apparatuses, each display apparatus may be provided to exactly output an integrated image or an individual image without interference of other signals.

Although FIG. 14 shows that each of the plurality of display apparatuses includes only a control driving circuit, the present disclosure is not limited thereto. Each of the plurality of display apparatuses may be provided to include an individual driving circuit as well as a control driving circuit to output an image.

Figure 15:
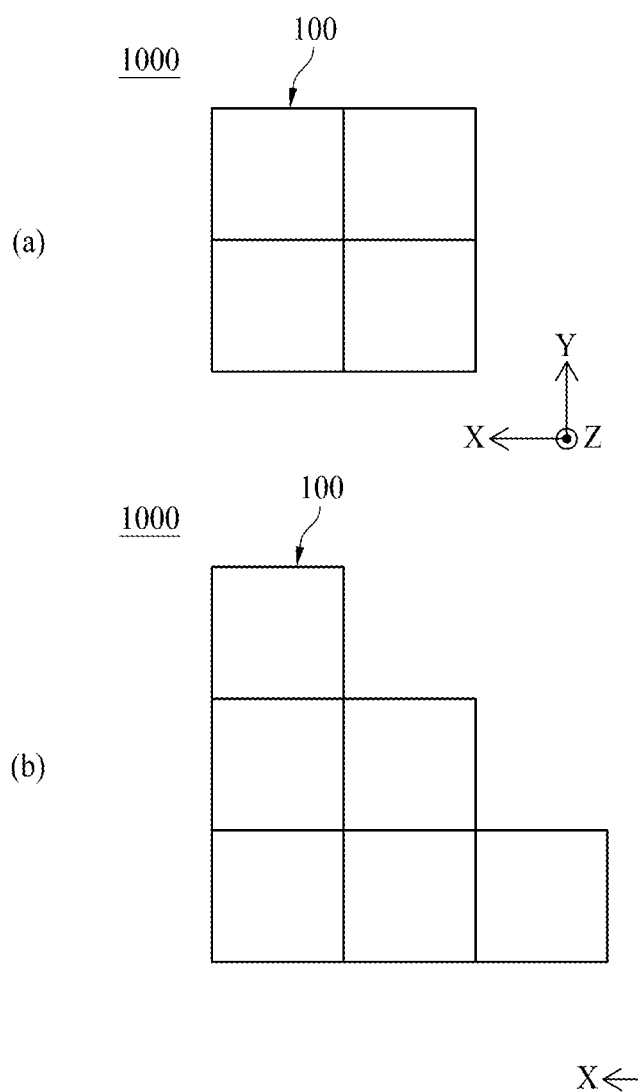
FIGS. 15(a) and 15(b) are schematic front views illustrating various arrangement structures of a tiled display apparatuses according to one embodiment of the present disclosure.

FIGS. 15(a) and 15(b) are schematic front views illustrating various arrangement structures of a tiled display apparatuses according to one embodiment of the present disclosure.

Referring to FIGS. 15(a) and 15(b), the tiled display apparatus 100 according to one embodiment of the present disclosure may be implemented by coupling or tiling a plurality of display apparatuses in various shapes.

In the tiled display apparatus 1000 according to FIG. 15(a), a plurality of display apparatuses 100 are disposed in a rectangular or matrix shape. As shown in FIG. 15(a), four display apparatuses 100 may be disposed in a rectangular shape so that the tiled display apparatus 1000 may be implemented. In this case, the display apparatuses disposed up and down based on the Y-axis direction may receive or transfer the power through their power transfer member 220 and power receiving member 250. In addition, the display apparatuses disposed up and down based on the Y-axis direction may be implemented as shown in FIG. 13 when receiving or transmitting signals through a wired manner, and may be implemented as shown in FIG. 14 when receiving or transmitting signals through a wireless manner, but the present disclosure is not limited thereto. The display apparatuses may be changed to receive or transmit signals through a wired manner and a wireless manner.

As shown in FIG. 15(a), the display apparatus disposed up and down in a first column may be coupled to the display apparatus, which is disposed up and down in a second column, in the X-axis direction. For example, since a recess groove 2141 is provided on a right side (or fourth side 214) of each of the display apparatuses disposed in the first column, and a protrusion 2131 is provided on a left side (or third side 213) of each of the display apparatuses disposed in the second column, the protrusion 2131 of each of the display apparatuses disposed in the second column may be inserted into the recess groove 2141 of each of the display apparatuses disposed in the first column, whereby the display apparatus disposed up and down in the first column and the display apparatus disposed up and down in the second column may be coupled to each other in the X-axis direction. Thus, as shown in FIG. 15(a), the tiled display apparatus 1000 may be implemented in the form of a matrix, and a seam may not be generated.

The tiled display apparatus 1000 according to FIG. 15(b) is an example in which a plurality of display apparatuses 100 are disposed in the form of a stepwise. As shown in FIG. 15(b), six display apparatuses 100 may be disposed in the form of a stepwise so that the tiled display apparatus 1000 may be implemented. In more detail, three display apparatuses may be disposed in the first column based on the Y-axis direction, two display apparatuses may be disposed in the second column based on the Y-axis direction, and one display apparatus may be disposed in a third column. In this case, the display apparatuses disposed up and down based on the Y-axis direction may receive or transfer the power through the power transfer member 220 and the power receiving member 250 each having the power transfer member 220 and the power receiving member 250. In addition, the display apparatuses disposed up and down based on the Y-axis direction may be implemented as shown in FIG. 13 when receiving or transmitting signals through a wired manner, and may be implemented as shown in FIG. 14 when receiving or transmitting signals through a wireless manner, but the present disclosure is not limited thereto. The display apparatuses may be changed to receive or transmit signals through a wired manner and a wireless manner.

As shown in FIG. 15(b), the display apparatus disposed up and down in the first column, the display apparatus disposed up and down in the second column and the display apparatus of a third column may be coupled to one another in the X-axis direction. For example, since a recess groove 2141 is provided on a right side (or fourth side 214) of each of the display apparatuses disposed in the first column, a protrusion 2131 is provided on a left side (or third side 213) of each of the display apparatuses disposed in the second column, a recess groove 2141 is provided on a right side (or fourth side 214) of each of the display apparatuses disposed in the second column, and a protrusion 2131 is disposed on a left side of each of the display apparatuses disposed in the third column, the protrusion 2131 of each of the display apparatuses disposed in the second column may be inserted into the recess groove 2141 of each of the display apparatuses disposed in the first column and the protrusion 2131 of each of the display apparatuses disposed in the third column may be inserted into the recess groove 2141 of each of the display apparatuses disposed in the second column, whereby the display apparatus disposed up and down in the second column and the display apparatus of the third column may be coupled to each other in the X-axis direction. Thus, as shown in FIG. 15(b), the tiled display apparatus 1000 may be implemented in the form of a stepwise, and a seam may not be generated.

Although the tiled display apparatus 1000 according to one embodiment of the present disclosure has been described as being implemented in the form of a rectangle, matrix and a stepwise, the plurality of display apparatuses 100 may be implemented in various forms because they may be coupled or tiled together to receive or transfer the power (or voltage) and signals. Therefore, in the tiled display apparatus 1000 according to one embodiment of the present disclosure, since the plurality of display apparatuses 100 may be disposed in various forms, the tiled display apparatus 1000 may be installed without being limited to the structure of the place where the display apparatus 100 is disposed, whereby a general use for the installation place may be improved.

Although the power (or voltage) is supplied and transferred in the Y-axis direction, that is, a vertical direction and the signal is transmitted and received only in the Y-axis direction, the present disclosure is not limited thereto. When each of the plurality of display apparatuses includes a power transmission member 220 and a power receiving member 250, which are disposed in the X-axis direction, and a signal receiver 1400 and a signal transmitter 1500, the power (or voltage) may be supplied and transferred and the signal may be transmitted and received in the X-axis direction, that is, a horizontal direction. Also, the tiled display apparatus 1000 according to one embodiment of the present disclosure may be implemented in the form of a wall without the stand frame 1100. In this case, the control driving circuit 1200 may be disposed to be embedded in a wall.

According to the present disclosure, the following advantageous effects may be obtained.

Since the tiled display apparatus 1000 according to one embodiment of the present disclosure may easily supply the power and signals to the plurality of display apparatuses 100, the degree of freedom for arrangement is high, whereby the tiled display apparatus 1000 may be implemented in various forms without limitation of place.

As the display apparatus according to the present disclosure is provided so that the support member for supporting the display panel includes a power transfer member, when the plurality of display apparatuses are disposed in a tiled shape, the power may be easily applied to another adjacent display panel. Therefore, since a separate power line does not need to be connected to each of the plurality of display apparatuses, the time for an installation task may be shortened.

As the tiled display apparatus according to the present disclosure is provided so that a support member of each of a plurality of display apparatuses is fastened in a sliding manner, an alignment time for the plurality of display apparatuses may be shortened, and the power may be easily applied to other adjacent display apparatuses through a power transfer member of each support member, whereby the time for an installation task may be shortened. Also, since a separate signal connection line is not required, the esthetic sense of external appearance may be improved, and the degree of freedom for the installation position of the plurality of display apparatuses may be improved.

It will be apparent to those skilled in the art that the present disclosure described above is not limited by the above-described embodiments and the accompanying drawings and that various substitutions, modifications and variations may be made in the present disclosure without departing from the spirit or scope of the disclosures. Consequently, it is intended that all variations or modifications derived from the meaning, scope and equivalent concept of the embodiments described herein fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus, comprising:
a display panel; and
a support member supporting the display panel, wherein the support member includes:
   a main body supporting the display panel; and
   a power transfer member disposed on a first side of the main body, wherein the power transfer member includes:
      a rotating portion rotatably coupled to the first side of the main body;
      a stepped portion disposed at a first portion of the rotating portion; and
      a terminal portion disposed at a second portion of the rotating portion that is opposite to the first portion of the rotating portion.

2. The display apparatus of claim 1, wherein the stepped portion protrudes from an upper surface of the rotating portion in a thickness direction of the rotating portion, and the stepped portion has an inclined surface on at least one side.

3. The display apparatus of claim 2, wherein the first side of the main body includes:
   an insertion groove into which the power transfer member is inserted;
   a bottom surface adjacent to the insertion groove; and
   a vertical surface perpendicular to the bottom surface, and wherein a distance between the bottom surface and a lower surface of the rotating portion corresponding to the stepped portion is equal to, or greater than, a length by which the stepped portion protrudes from the first end of the rotating portion.

4. The display apparatus of claim 1, wherein the support member includes a support protruding from the first side of the main body, and
the support includes:
   a pair of guide members disposed in parallel with a front surface of the display panel; and
   a pair of arms connected to the pair of guide members and disposed in parallel with the first side of the main body in a thickness direction of the main body.

5. The display apparatus of claim 4, wherein the main body further includes a second side disposed in parallel with the first side of the main body, and
the second side of the main body includes:
   a fastening portion inserted into a support groove provided between the pair of guide members; and
   a recess with a width smaller than a width of the fastening portion.

6. The display apparatus of claim 4, wherein the main body further includes a second side disposed in parallel with the first side of the main body,
   the support member is a first support member and the support is a first support,
   at least a portion of the first support is a conductive material,
   at least a portion of the second side of the main body is the conductive material and is configured to be electrically connected to a second support of the conductive material of a second support member of another display apparatus, and
   the first support of the conductive material and the power transfer member are configured to transfer voltages different from each other.

7. The display apparatus of claim 1, wherein the support member further includes a power receiving member having a power receiving terminal connectable to a power source,
   the power receiving member is disposed on a second side of the main body, the second side of the main body disposed in parallel with the first side of the main body, and
   a width of the power receiving terminal is equal to or wider than a width of the terminal portion of the power transfer member.

8. The display apparatus of claim 1, wherein the main body further includes:
   a second side disposed in parallel with the first side of the main body; and
   a third side connected to one side of the first side of the main body and to one side of the second side of the main body,
   wherein the third side of the main body includes a protrusion extending in a direction perpendicular to a thickness direction of the main body, and
   the protrusion of the third side of the main body has a thickness less than a thickness of the main body.

9. The display apparatus of claim 8, wherein the main body further includes a fourth side disposed in parallel with the third side of the main body, and the fourth side of the main body includes a recess groove into which the protrusion of the third side of the main body is inserted.

10. The display apparatus of claim 1, wherein the power transfer member of the support member is one of a plurality of power transfer members including a first power transfer member configured to transfer a positive voltage and a second power transfer member configured to transfer a negative voltage.

11. A display apparatus, comprising:
a display panel;
a support member supporting the display panel; and
a power transfer member rotatably disposed on a first side of the support member,
wherein the support member includes a main body supporting the display panel, wherein the power transfer member includes:
- a rotating portion rotatably coupled to the first side of the main body;
- a stepped portion disposed at a first portion of the rotating portion, and
- a terminal portion disposed at a second portion of the rotating portion that is opposite to the first portion of the rotating portion.

12. The display apparatus of claim 11, further comprising:
a power receiving member disposed on a second side of the support member, the second side of the support member disposed in parallel with the first side of the support member,
wherein the power receiving member is disposed at a position corresponding to the power transfer member.

13. The display apparatus of claim 12, further comprising:
an individual driving circuit disposed inside the support member, the individual driving circuit configured to drive the display panel;
a first connector connecting the individual driving circuit with the power receiving member; and
a second connector connecting the power receiving member with the power transfer member.

14. The display apparatus of claim 11, wherein the display panel includes:
- a substrate; and
- a display portion having a plurality of pixels disposed on the substrate, and
- a size of the display portion is the same as that of the substrate.

15. The display apparatus of claim 14, wherein each of the plurality of pixels is arranged on the substrate at a first interval,
the first interval is a distance between centers of two adjacent pixels, and
a second interval between a center of outermost pixels of the plurality of pixels and an outer side of the substrate is less than, or equal to, a half of the first interval.

16. A tiled display apparatus, comprising:
a stand frame; and
a plurality of display apparatuses connected to the stand frame in a tiled arrangement,
wherein each of the plurality of display apparatuses includes:
- a display panel;
- a support member supporting the display panel; and
- a power transfer member rotatably disposed on a first side of the support member,
wherein the support member includes a main body supporting the display panel,
wherein the power transfer member includes:
- a rotating portion rotatably coupled to the first side of the main body;
- a stepped portion disposed at a first portion of the rotating portion; and
- a terminal portion disposed at a second portion of the rotating portion that is opposite to the first portion of the rotating portion.

17. The tiled display apparatus of claim 16, wherein the stand frame includes a control driving circuit configured to control each of the plurality of display apparatuses,
each of the plurality of display apparatuses includes an individual driving circuit, and
the control driving circuit is connected to the individual driving circuit of each of the plurality of display apparatuses through a plurality of signal connectors.

18. The tiled display apparatus of claim 16, wherein each of the plurality of display apparatuses includes:
a control driving circuit;
a signal receiver disposed on a first side of the control driving circuit; and
a signal transmitter disposed on a second side of the control driving circuit and spaced apart from the signal receiver.

19. The tiled display apparatus of claim 18, wherein the plurality of display apparatuses include a first display apparatus and a second display apparatus tiled on the first display apparatus, and
a distance between the signal transmitter of the first display apparatus and the signal receiver of the second display apparatus is shorter than a distance between the signal receiver of the second display apparatus and the signal transmitter of the second display apparatus.

* * * * *